United States Patent
Hayano

(10) Patent No.: US 12,167,683 B2
(45) Date of Patent: Dec. 10, 2024

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventor: Tetsuji Hayano, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 542 days.

(21) Appl. No.: 17/027,113

(22) Filed: Sep. 21, 2020

(65) Prior Publication Data

US 2021/0202861 A1 Jul. 1, 2021

(30) Foreign Application Priority Data

Dec. 26, 2019 (KR) .................. 10-2019-0175552

(51) Int. Cl.
| | |
|---|---|
| H01L 51/00 | (2006.01) |
| C07F 5/02 | (2006.01) |
| C09K 11/06 | (2006.01) |
| H10K 85/60 | (2023.01) |
| H10K 50/11 | (2023.01) |
| H10K 101/10 | (2023.01) |

(52) U.S. Cl.
CPC .......... *H10K 85/631* (2023.02); *C07F 5/027* (2013.01); *C09K 11/06* (2013.01); *C09K 2211/1007* (2013.01); *H10K 50/11* (2023.02); *H10K 2101/10* (2023.02)

(58) Field of Classification Search
CPC ...................................... C07F 5/027
See application file for complete search history.

(56) References Cited

U.S. PATENT DOCUMENTS

| | | |
|---|---|---|
| 10,205,105 B2 | 2/2019 | Kwong et al. |
| 10,418,568 B2 | 9/2019 | Lam et al. |
| 2006/0175958 A1* | 8/2006 | Gerhard .................. C09B 57/00 313/504 |
| 2006/0255332 A1* | 11/2006 | Becker ................ C09B 67/0033 252/301.36 |
| 2012/0056169 A1* | 3/2012 | Kaiser .................. H01L 51/5016 257/E51.024 |
| 2014/0027734 A1* | 1/2014 | Kwong ................ H10K 85/615 546/13 |
| 2015/0097162 A1 | 4/2015 | Ono et al. |
| 2016/0049600 A1* | 2/2016 | Hatakeyama ........... C09B 57/00 548/405 |
| 2018/0040821 A1 | 2/2018 | Hatakeyama et al. |
| 2018/0047913 A1* | 2/2018 | Ono .......................... C07F 5/02 |
| 2019/0067577 A1 | 2/2019 | Xia |
| 2019/0214575 A1 | 7/2019 | Ono et al. |
| 2019/0256538 A1 | 8/2019 | Hatakeyama et al. |
| 2021/0391540 A1* | 12/2021 | Lee ........................ C09K 11/06 |

FOREIGN PATENT DOCUMENTS

| | | |
|---|---|---|
| JP | 5819534 B2 | 11/2015 |
| JP | WO2016/143624 A1 | 9/2016 |
| KR | 10-2015-0056567 A | 5/2015 |
| KR | 10-2016-0141661 A | 12/2016 |
| KR | 10-2017-0126888 A | 11/2017 |
| KR | 10-2019-0051003 A | 5/2019 |
| WO | WO 2014/042197 A1 | 3/2014 |

OTHER PUBLICATIONS

S. Maruyama et al., 12 J. Mater. Chem., 2245-2249 (2002) (Year: 2002).*

Lien, Yi-Jyun et al., "First N-Borylated Emitters Displaying Highly Efficient Thermally Activated Delayed Fluorescence and High-Performance OLEDs", *Applied Materials & Interfaces*, 2017, 9, p. 27090-27101.

Hatakeyama, Takuji et al., "Synthesis of BN-Fused Polycyclic Aromatics via Tandem Intramolecular Electrophilic Arene Borylation", *Journal of the American Chemical Society*, 2011, 133(46), p. 18614-18617.

* cited by examiner

*Primary Examiner* — Alexander R Pagano
(74) *Attorney, Agent, or Firm* — Lewis Roca Rothgerber Christie LLP

(57) ABSTRACT

An organic electroluminescence device includes a first electrode, a hole transport region disposed on the first electrode, an emission layer disposed on the hole transport region, an electron transport region disposed on the emission layer, and a second electrode disposed on the electron transport region. The emission layer includes a polycyclic compound represented by Formula 1 to thereby achieve high luminous efficiency:

20 Claims, 2 Drawing Sheets

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0175552, filed on Dec. 26, 2019, the entire content of which is hereby incorporated by reference.

BACKGROUND

One or more aspects of embodiments of the present disclosure relate to an organic electroluminescence device and a polycyclic compound for an organic electroluminescence device.

Organic electroluminescence displays are recently being developed as image display devices. Unlike liquid crystal displays and/or the like, organic electroluminescence displays are so-called self-luminescent display apparatuses, in which holes and electrons respectively injected from a first electrode and a second electrode recombine in an emission layer, and thus a luminescent material including an organic compound in the emission layer emits light to implement display.

In the application of an organic electroluminescence device to a display apparatus, there is a demand for an organic electroluminescence device having a low driving voltage, high luminous efficiency, and a long lifespan, and there is a demand for new materials capable of stably attaining such characteristics for an organic electroluminescence device.

In recent years, in order to implement a highly efficient organic electroluminescence device, materials utilizing triplet state energy phosphorescence emission, delayed fluorescence triplet-triplet annihilation (TTA) (in which singlet excitons are generated by collision of triplet excitons), and/or thermally activated delayed fluorescence (TADF) are being developed.

SUMMARY

One or more aspects of embodiments of the present disclosure are directed toward a highly efficient organic electroluminescence device having a long lifespan, and a polycyclic compound used therein.

One or more aspects of embodiments of the present disclosure are directed toward an organic electroluminescence device including a thermally activated delayed fluorescence (TADF) emission material and a polycyclic compound used as a thermally activated delayed fluorescence emission material.

One or more example embodiments of the present disclosure provide an organic electroluminescence device including a first electrode, a hole transport region disposed on the first electrode, an emission layer disposed on the hole transport region, an electron transport region disposed on the emission layer, and a second electrode disposed on the electron transport region, and the emission layer includes a polycyclic compound represented Formula 1:

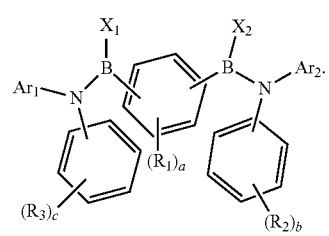

Formula 1

In Formula 1, $X_1$ and $X_2$ may each independently be a substituted or unsubstituted arylamine group, a substituted or unsubstituted aryl group having 6 to 30 ring-forming carbon atoms, or a substituted or unsubstituted heteroaryl group having 2 to 30 ring-forming carbon atoms; $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring; $R_1$ to $R_3$ may each independently be a hydrogen atom, a deuterium atom, a halogen atom, a nitro group, a cyano group, a hydroxy group, a substituted or unsubstituted boron group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring; a may be an integer of 0 to 4, and b and c may each independently be an integer of 0 to 5.

In some embodiments, Formula 1 may be represented by any one of Formulae 2 to 4:

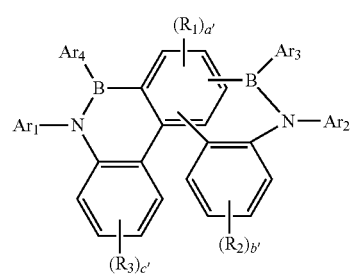

Formula 2

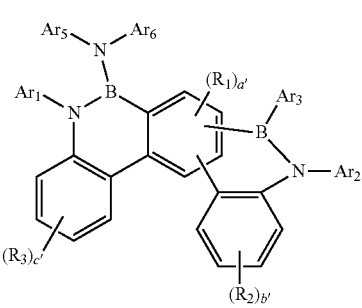

Formula 3

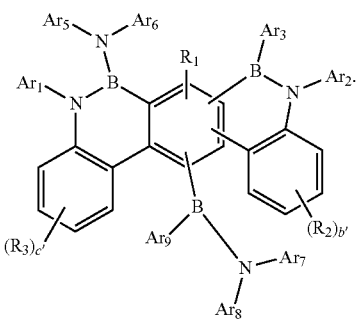

Formula 4

In Formulae 2 to 4, $Ar_3$ to $Ar_9$ may each independently be a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring; a' may be an integer of 0 to 2; b' and c' may be an integer of 0 to 4, and $Ar_1$, $Ar_2$, and $R_1$ to $R_3$ may each independently be the same as defined in Formula 1.

In some embodiments, Formula 2 may be represented by Formula 2-1 or Formula 2-2:

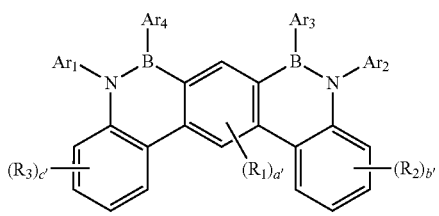

Formula 2-1

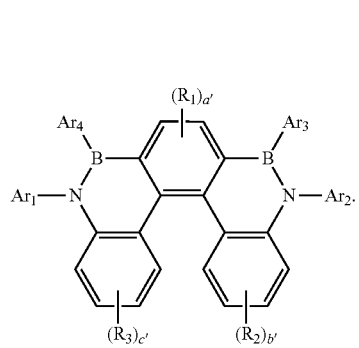

Formula 2-2

In Formulas 2-1 and 2-2, $Ar_1$ to $Ar_4$, $R_1$ to $R_3$, a', b', and c' may each independently be the same as defined in Formula 2.

In some embodiments, Formula 2 may be represented by Formula 2-3:

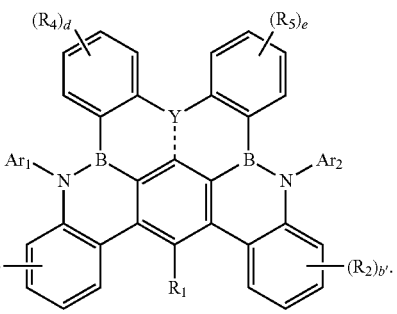

Formula 2-3

In Formula 2-3, Y may be $CR_6$, N, or O; the dotted line may refer to an optional bond, where when Y is $CR_6$, or N, the dotted line refers to a bond, and when Y is O, the bond along the dotted line is omitted; $R_4$ to $R_6$ may each independently be a hydrogen atom, a deuterium atom, a halogen atom, a nitro group, a cyano group, a hydroxy group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted hetero aryl silyl group, and/or bonded to an adjacent group to form a ring; d and e may each independently be an integer of 0 to 4; and $Ar_1$, $Ar_2$, $R_1$ to $R_3$, b', and c' may each independently be the same as defined in Formula 2.

In some embodiments, Formula 3 may be represented by Formula 3-1:

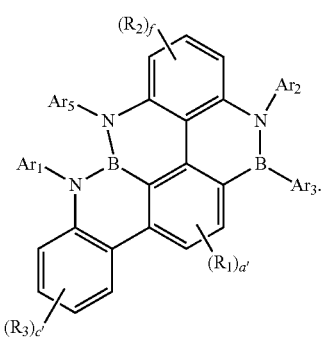

Formula 3-1

In Formula 3-1, f may be an integer of 0 to 3, and $Ar_1$ to $Ar_3$, $Ar_5$, $R_1$ to $R_3$, a', and c' may each independently be the same as defined in Formula 3.

In some embodiments, Formula 3-1 may be represented by Formula 3-2:

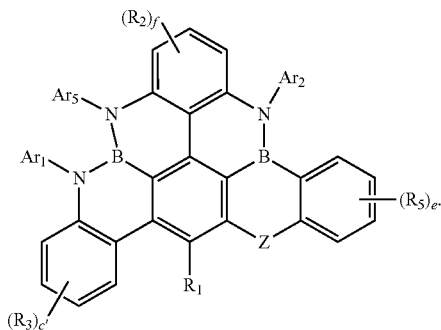

Formula 3-2

In Formula 3-2, Z may be $CR_7R_8$, $NR_9$, or O; $R_5$ and $R_7$ to $R_9$ may each independently be a hydrogen atom, a deuterium atom, a halogen atom, a nitro group, a cyano group, a hydroxy group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring; e may be an integer of 0 to 4, and $Ar_1$, $Ar_2$, $Ar_5$, $R_1$ to $R_3$, c', and f may each independently be the same as defined in Formula 3-1.

In some embodiments, Formula 4 may be represented by Formula 4-1:

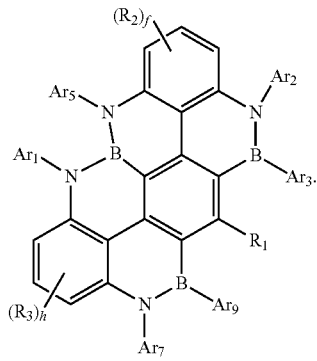

Formula 4-1

In Formula 4-1, f and h may be an integer of 0 to 3, and $Ar_1$ to $Ar_3$, $Ar_5$, $Ar_7$, $Ar_9$, and $R_1$ to $R_3$ may each independently be the same as defined in Formula 4.

Formula 4-1 may be represented by Formula 4-2:

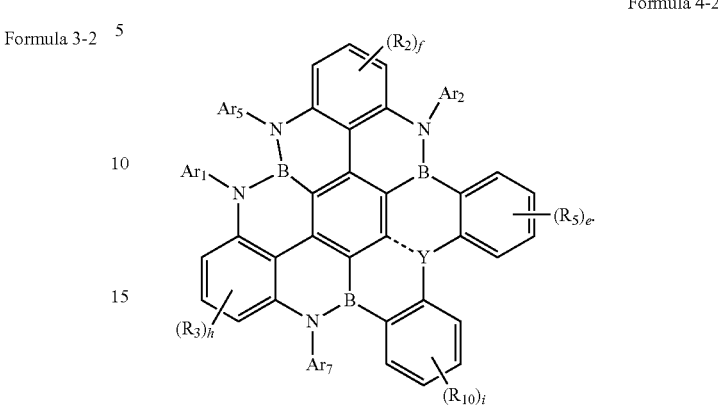

Formula 4-2

In Formula 4-2, Y may be $CR_6$, N, or O; the dotted line may refer to an optional bond, where when Y is $CR_6$ or N, the dotted line refers to a bond, and when Y is O, the bond along the dotted line is omitted; $R_5$, $R_6$, and $R_{10}$ may each independently be a hydrogen atom, a deuterium atom, a halogen atom, a nitro group, a cyano group, a hydroxy group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring; e and i may each independently be an integer of 0 to 4; and $Ar_1$, $Ar_2$, $Ar_5$, $Ar_7$, $R_2$, $R_3$, f, and h may each independently be the same as defined in Formula 4-1.

In some embodiments, $Ar_1$ and $Ar_2$ may each independently be represented by Formula 5:

Formula 5

In Formula 5, $Y_1$ to $Y_5$ may each independently be CA or N, and A may be hydrogen, deuterium, or an alkyl group having 1 to 20 carbon atoms.

At least one of $R_1$ to $R_3$ in Formula 1 may be a deuterium atom, or may include a deuterium atom as a substituent.

The compound represented by Formula 1 may be any one of the compounds represented by Compound Group 1.

One or more example embodiments of the present disclosure provide a polycyclic compound represented by Formula 1.

BRIEF DESCRIPTION OF THE FIGURES

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
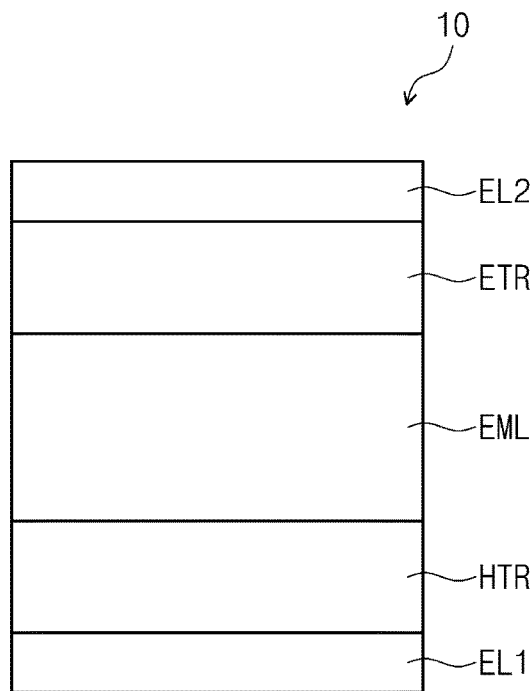
FIG. 1 is a cross-sectional view schematically illustrating an organic electroluminescence device according to an embodiment of the present disclosure.

The present disclosure may have various modifications and may be embodied in different forms, and example embodiments will be explained in more detail with reference to the accompanying drawings. The present disclosure may, however, be embodied in different forms and should not be construed as being limited to the embodiments set forth herein. Rather, all modifications, equivalents, and substitutions that are included in the spirit and technical scope of the present disclosure should be included in the present disclosure.

It will be understood that when an element or layer is referred to as being "on", "connected to" or "coupled to" another element or layer, it can be directly on, connected or coupled to the other element or layer, or intervening elements or layers may be present. When an element is referred to as being "directly on," "directly connected to," or "directly coupled to" another element, there are no intervening elements present.

Like numbers refer to like elements throughout, and duplicative descriptions thereof may not be provided. Also, in the drawings, the thicknesses, ratios, and dimensions of elements may be exaggerated for an effective description of technical contents.

The term "and/or," includes any and all combinations of one or more of the associated listed items. As used herein, the singular forms "a," "an," and "the" are intended to include the plural forms as well, unless the context clearly indicates otherwise.

As used herein, expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure".

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and/or the like are used to describe the relationship of the configurations shown in the drawings. The terms are relative concepts, and are used with reference to the directions indicated in the drawings.

Unless otherwise defined, all terms (including technical and scientific terms) used herein have the same meaning as commonly understood by one of ordinary skill in the art to which the present disclosure pertains. It is also to be understood that terms should be interpreted as having a meaning that is consistent with their meaning in the context of the relevant art (such as defined in commonly used dictionaries) unless expressly defined herein, and should not be interpreted in an idealized or overly formal sense.

It should be understood that the terms "includes," "including," "comprises," "comprising," and/or "have," are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, an organic electroluminescence device according to an embodiment of the present disclosure and a compound of an embodiment included therein will be described with reference to the accompanying drawings.

FIGS. 1 to 4 are cross-sectional views schematically illustrating an organic electroluminescence device according to an embodiment of the present disclosure. Referring to FIGS. 1 to 4, in an organic electroluminescence device 10 according to an embodiment, a first electrode EL1 and a second electrode EL2 are disposed to face each other, and an emission layer EML may be disposed between the first electrode EL1 and the second electrode EL2.

In some embodiments, the organic electroluminescence device 10 of an embodiment may further include a plurality of functional layers between the first electrode EL1 and the second electrode EL2 in addition to the emission layer EML. The plurality of functional layers may include a hole transport region HTR and an electron transport region ETR. For example, the organic electroluminescence device 10 according to an embodiment may include the first electrode EL1, the hole transport region HTR, the emission layer EML, the electron transport region ETR, and the second electrode EL2, sequentially stacked in this order. In addition, the organic electroluminescence device 10 of an embodiment may include a capping layer CPL disposed on the second electrode EL2.

The organic electroluminescence device 10 of an embodiment includes a polycyclic compound of an embodiment, which will be described later, in the emission layer EML disposed between the first electrode EL1 and the second electrode EL2. However, embodiments are not limited thereto, and the organic electroluminescence device 10 of an embodiment may include a compound according to an embodiment not only in the emission layer EML but also in the hole transport region HTR or electron transport region ETR, which are among the plurality of functional layers disposed between the first electrode EL1 and the second electrode EL2, or in the capping layer CPL disposed on the second electrode EL2.

Figure 2:
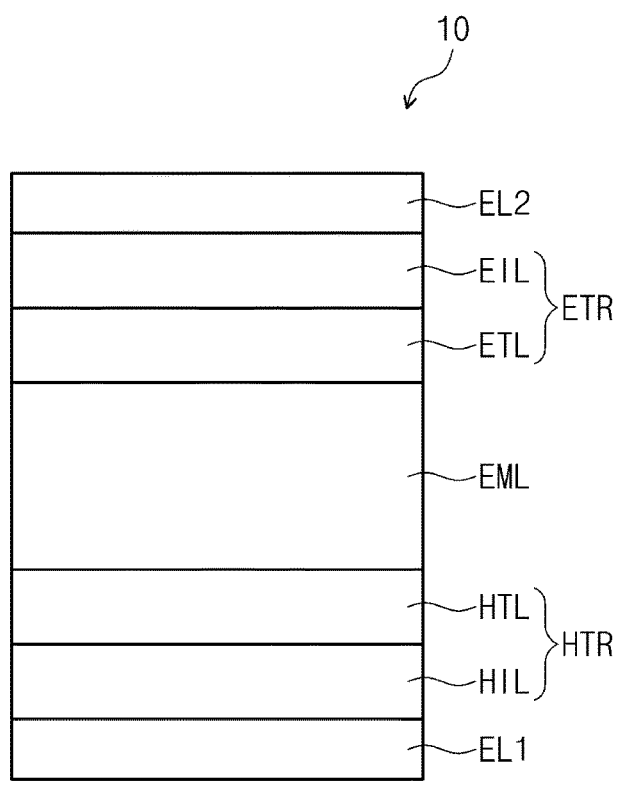
FIG. 2 is a cross-sectional view schematically illustrating an organic electroluminescence device according to an embodiment of the present disclosure.
Figure 3:
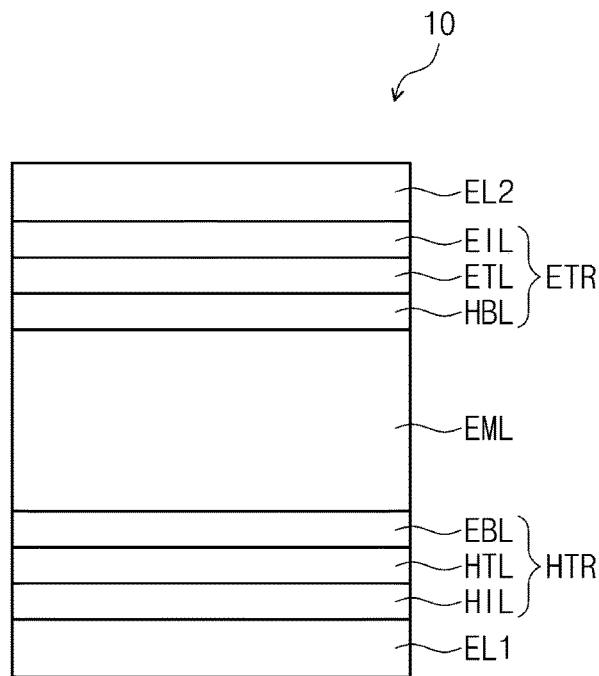
FIG. 3 is a cross-sectional view schematically illustrating an organic electroluminescence device according to an embodiment of the present disclosure.
Figure 4:
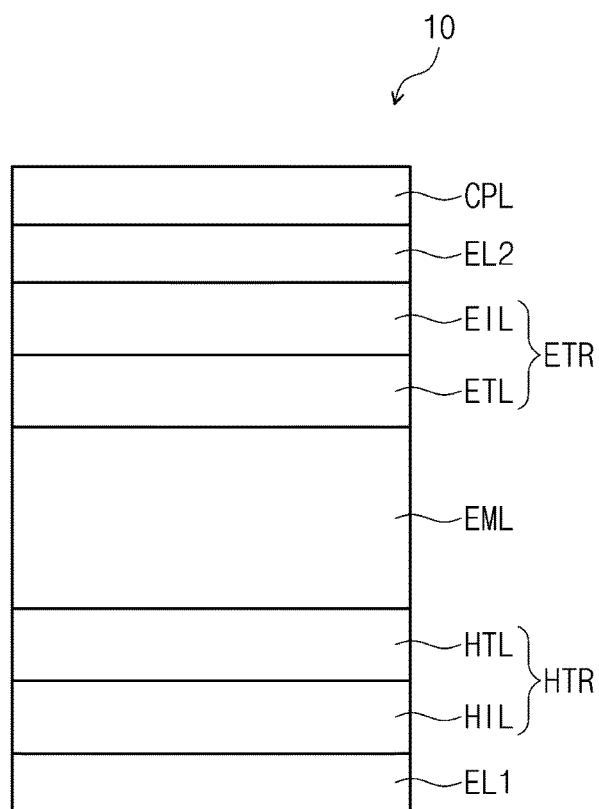
FIG. 4 is a cross-sectional view schematically illustrating an organic electroluminescence device according to an embodiment of the present disclosure.

Compared to FIG. 1, FIG. 2 illustrates a cross-sectional view of an organic electroluminescence device 10 of an embodiment, in which the hole transport region HTR includes a hole injection layer HIL and a hole transport layer HTL, and the electron transport region ETR includes an electron injection layer EIL and an electron transport layer ETL. Compared to FIG. 1, FIG. 3 illustrates a cross-sectional view of an organic electroluminescence device 10 of an embodiment, in which the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL. Compared to FIG. 2, FIG. 4 illustrates a cross-sectional view of an organic electroluminescence device 10 of an embodiment including a capping layer CPL disposed on the second electrode EL2.

The first electrode EL1 may have conductivity. The first electrode EL1 may be formed of a metal alloy or a conductive compound. The first electrode EL1 may be a pixel electrode or an anode. The first electrode EL1 may be a transmissive electrode, a transflective electrode, or a reflective electrode. When the first electrode EL1 is a transmissive electrode, the first electrode EL1 may include a transparent metal oxide (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), a compound thereof, or a mixture thereof (e.g., a mixture of Ag and Mg). In some embodiments, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but is not limited thereto. The thickness of the first electrode EL1 may be about 1,000 Å to about 10,000 Å, for example, about 1,000 Å to about 3,000 Å

The hole transport region HTR is provided on the first electrode EL1. The hole transport region HTR may include at least one of a hole injection layer HIL, a hole transport layer HTL, a hole buffer layer, or an electron blocking layer EBL.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of a hole injection layer HIL or a hole transport layer HTL, or may have a single layer structure formed of a hole injection material and a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, but embodiments are not limited thereto.

The hole transport region HTR may be formed using one or more suitable methods (such as a vacuum deposition method, a spin coating method, a cast method, a Langmuir-Blodgett (LB) method, an inkjet printing method, a laser printing method, and/or a laser induced thermal imaging (LITI) method).

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4', 4'-[tris(3-methylphenyl)phenylamino]triphenylamine] (m-MTDATA), 4,4', 4'-tris(N,N-diphenylamino)triphenylamine (TDATA), 4,4', 4'-tris{N,-(2-naphthyl)-N-phenylamino)-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrene sulfonate) (PANI/PSS), N,N'-di(naphthalene-I-yl)-N,N'-diphenyl-benzidine (NPD), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include any suitable materials available in the art. For example, the hole transport layer HTL may further include carbazole derivatives (such as N-phenyl carbazole and/or polyvinyl carbazole), fluorene derivatives, N,N'-bis(3-methylphenyl)-N,N'-diphenyl-[1,1-biphenyl]-4,4'-diamine (TPD), triphenylamine derivatives (such as 4,4',4'-tris(N-carbazolyl)triphenylamine (TCTA)), N,N'-di(1-naphthalen-1-yl)-N,N'-diphenyl-benzidine (NPD), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The electron blocking layer EBL may include, for example, carbazole derivatives (such as N-phenyl carbazole and/or polyvinyl carbazole), fluorene derivatives, N,N'-bis(3-methylphenyl)-N,N'-diphenyl-[1,1-biphenyl]-4,4'-diamine (TPD), triphenylamine derivatives (such as 4,4',4'-tris(N-carbazolyl)triphenylamine (TCTA)), N,N'-di(1-naphthalen-1-yl)-N,N'-diphenyl-benzidine (NPD), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), mCP, etc.

The thickness of the hole transport region HTR may be about 50 Å to about 15,000 Å, for example, about 100 Å to about 5,000 Å. The thickness of the hole injection region HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL, and the electron blocking layer EBL satisfy the above-described ranges, satisfactory hole transport properties may be achieved without a substantial increase in driving voltage.

The hole transport region HTR may further include, in addition to the above-described materials, a charge generating material to increase conductivity. The charge generating material may be dispersed substantially uniformly or non-uniformly in the hole transport region HTR. The charge generating material may be, for example, a p-dopant. The p-dopant may be selected from quinone derivatives, metal oxides, and cyano group-containing compounds, but is not limited thereto. Non-limiting examples of the p-dopant may include quinone derivatives (such as tetracyanoquinodimethane (TCNQ) and/or 2,3,5,6-tetrafluoro-7,7,8,8-tetracyanoquinodimethane (F4-TCNQ)), metal oxides (such as tungsten oxide and/or molybdenum oxide), etc., but is not limited thereto.

As described above, the hole transport region HTR may further include at least one of a hole buffer layer or an electron blocking layer EBL in addition to the hole injection layer HIL and the hole transport layer HTL. The hole buffer layer may compensate for a resonance distance according to the wavelength of light emitted from an emission layer EML and may thereby increase the light emission efficiency of the device. Materials that may be included in the hole transport region HTR may also be used or included in the hole buffer layer. The electron blocking layer EBL may prevent or reduce electron injection from the electron transport region ETR to the hole transport region HTR.

The emission layer EML may be provided on the hole transport region HTR. The thickness of the emission layer EML may be, for example, about 100 Å to about 1000 Å or from about 100 Å to about 300 Å. The emission layer EML may have a single layer formed of a single material, a single layer formed of a plurality of different materials, or a multilayer structure having a plurality of layers formed of a plurality of different materials.

The emission layer EML may be to emit one of red, green, blue, white, yellow or cyan light. The emission layer EML may include a fluorescence emission material and/or a phosphorescence emission material.

In an embodiment, the emission layer EML may be a fluorescence emission layer. For example, some of the light emitted from the emission layer EML may result from thermally activated delayed fluorescence (TADF). Specifically, the emission layer EML may include a luminescent component that emits thermally activated delayed fluorescence, and in an embodiment, the emission layer EML may be an emission layer that emits thermally activated delayed fluorescence emitting blue light.

The emission layer EML of the organic electroluminescence device 10 of an embodiment includes a polycyclic compound according to an embodiment of the present disclosure.

In the description, the term "substituted or unsubstituted" refers to a state of being unsubstituted, or substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents exemplified above may be unsubstituted or further substituted. For example, a biphenyl group may be interpreted as an aryl group or as a phenyl group substituted with a phenyl group.

In the description, the term "bonded to an adjacent group to form a ring" may refer to a state of being bonded to an adjacent group to form a substituted or unsubstituted hydrocarbon ring, or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The rings formed by being bonded to an adjacent group may be monocyclic or polycyclic. In some embodiments, the rings formed by being bonded to each other may be connected to another ring to form a spiro structure.

In the description, the term "an adjacent group" may refer to a substituent on the same atom or point, a substituent on an atom that is directly connected to the base atom or point, or a substituent sterically positioned (e.g., within intramolecular bonding distance) to the corresponding substituent. For example, two methyl groups in 1,2-dimethylbenzene may be interpreted as mutually "adjacent groups" and two ethyl groups in 1,1-diethylcyclopentane may be interpreted as mutually "adjacent groups".

In the description, non-limiting examples of the halogen atom include a fluorine atom, a chlorine atom, a bromine atom and an iodine atom.

In the description, unless otherwise specified, an alkyl group may be a chain or cyclic alkyl group. The number of carbon atoms in the alkyl group may be 1 to 50, 1 to 30, 1 to 20, 1 to 10, or 1 to 6. Non-limiting examples of the chain-type alkyl group include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc. Non-limiting examples of the cyclic alkyl group include a cyclopentyl group, a cyclohexyl group, a 4-methylcyclohexyl group, a 4-t-butylcyclohexyl group, a cyclooctyl group, etc.

In the description, the term "alkenyl group" refers to a hydrocarbon group including at least one carbon-carbon double bond in the middle or at the end of an alkyl group having 2 or more carbon atoms. The alkenyl group may be linear or branched. Although the number of carbon atoms is not specifically limited, it may be 2 to 30, 2 to 20, or 2 to 10. Non-limiting examples of the alkenyl group include a vinyl group, a 1-butenyl group, a 1-pentenyl group, a 1,3-butadienyl aryl group, a styrenyl group, a styryl vinyl group, etc.

In the description, the term "alkynyl group" refers to a hydrocarbon group including at least one carbon-carbon triple bond in the middle or at the end of an alkyl group having 2 or more carbon atoms. The alkynyl group may be linear or branched. Although the number of carbon atoms is not specifically limited, it may be 2 to 30, 2 to 20, or 2 to 10. Non-limiting examples of the alkynyl group include an ethynyl group, a propynyl group, etc.

In the description, the term "hydrocarbon ring group" may refer to any functional group or substituent derived from an aliphatic hydrocarbon ring, or an any functional group or substituent derived from an aromatic hydrocarbon ring. The number of ring-forming carbon atoms in the hydrocarbon ring group may be 5 to 60, 5 to 30, or 5 to 20.

In the description, the term "aryl group" may refer to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Non-limiting examples of the aryl group include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc.

In the description, the term "heterocyclic group" may refer to any functional group or substituent derived from a ring containing at least one of boron (B), oxygen (O), nitrogen (N), phosphorus (P), silicon (Si), or sulfur (S) as a hetero atom. The heterocyclic group may be an aliphatic heterocyclic group or an aromatic heterocyclic group. The aromatic heterocyclic group may be a heteroaryl group. The aliphatic heterocycle and aromatic heterocycle may be monocyclic or polycyclic.

In the description, the heterocyclic group may include at least one of B, O, N, P, Si or S as a hetero atom. When the heterocyclic group contains two or more hetero atoms, the two or more hetero atoms may be the same as or different from each other. The heterocyclic group may be a monocyclic heterocyclic group or a polycyclic heterocyclic group, and may include a heteroaryl group. The number of ring-forming carbon atoms in the heterocyclic group may be 2 to 30, 2 to 20, or 2 to 10.

In the description, the aliphatic heterocyclic group may include at least one of B, O, N, P, Si, or S as a hetero atom. The number of ring-forming carbon atoms in the aliphatic heterocyclic group may be 2 to 30, 2 to 20, or 2 to 10. Non-limiting examples of the aliphatic heterocyclic group include an oxirane group, a thiirane group, a pyrrolidine group, a piperidine group, a tetrahydrofuran group, a tetrahydrothiophene group, a thiane group, a tetrahydropyran group, a 1,4-dioxane group, etc.

In the description, a heteroaryl group may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Non-limiting examples of the heteroaryl group include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc.

In the description, the number of carbon atoms in an amine group is not particularly limited, but may be 1 to 30. The amine group may include an alkyl amine group, an aryl amine group, or a heteroaryl amine group. Non-limiting examples of the amine group include a methylamine group, a dimethylamine group, a phenylamine group, a diphenylamine group, a naphthylamine group, a 9-methyl-anthracenylamine group, a triphenylamine group, etc.

In the description, the thiol group may be an alkylthio group or an arylthio group.

In the description, an alkoxy group may be linear, branched or cyclic. The number of carbon atoms in the alkoxy group is not particularly limited, but for example, may be 1 to 20 or 1 to 10. Non-limiting examples of an oxy group include methoxy, ethoxy, n-propoxy, isopropoxy, butoxy, pentyloxy, hexyloxy, octyloxy, nonyloxy, decyloxy, benzyloxy, etc.

In the description, "-" refers to a point of connection.

The polycyclic compound according to an embodiment of the present disclosure is represented by Formula 1:

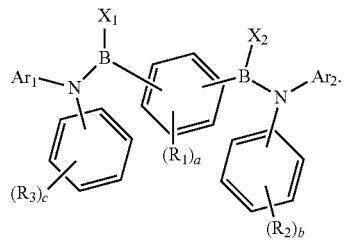

Formula 1

In Formula 1, $X_1$ and $X_2$ may each independently be a substituted or unsubstituted arylamine group, a substituted or unsubstituted aryl group having 6 to 30 ring-forming carbon atoms, or a substituted or unsubstituted heteroaryl group having 2 to 30 ring-forming carbon atoms.

In Formula 1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring.

In Formula 1, $R_1$ to $R_3$ may each independently be a hydrogen atom, a deuterium atom, a halogen atom, a nitro group, a cyano group, a hydroxy group, a substituted or unsubstituted boron group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring.

In Formula 1, a may be an integer of 0 to 4. When a is two or more, a plurality of $R_1$'s may be the same as or different from each other.

In Formula 1, b and c may each independently be an integer of 0 to 5. When b is 2 or more, a plurality of $R_2$'s may be the same as or different from each other, and when c is 2 or more, a plurality of $R_3$'s may be the same as or different from each other.

In an embodiment, $Ar_1$ and $Ar_2$ in Formula 1 may each independently be represented by Formula 5:

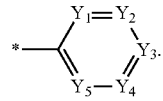

Formula 5

In Formula 5, $Y_1$ to $Y_5$ may each independently be CA or N.

In Formula 5, A may be hydrogen, deuterium, or an alkyl group having 1 to 20 carbon atoms.

In an embodiment, at least one of $R_1$ to $R_3$ in Formula 1 may be a deuterium atom, or may include a deuterium atom as a substituent.

In an embodiment, Formula 1 may be represented by Formula 1-1:

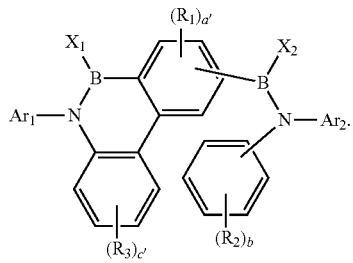

Formula 1-1

In Formula 1-1, a' is an integer of 0 to 2. When a' is 2, a plurality of $R_1$'s may be the same as or different from each other.

In Formula 1-1, c' may be an integer of 0 to 4. When c' is two or more, a plurality of $R_3$'s may be the same as or different from each other.

In Formula 1-1, $X_1$, $X_2$, $Ar_1$, $Ar_2$, b, and $R_1$ to $R_3$ may each independently be the same as defined in Formula 1.

In an embodiment, Formula 1 may be represented by Formula 2:

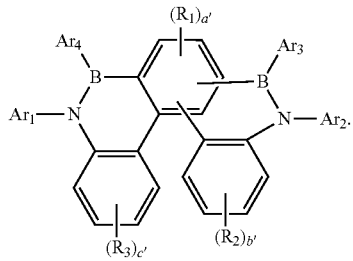

Formula 2

In Formula 2, $Ar_3$ and $Ar_4$ may each independently be a substituted or unsubstituted aryl group having 6 to 30 ring-forming carbon atoms, a substituted or unsubstituted heteroaryl group having 2 to 30 ring-forming carbon atoms, and/or bonded to an adjacent to form a ring.

In Formula 2, a' may be an integer of 0 to 2. When a' is 2, a plurality of $R_1$'s may be the same as or different from each other.

In Formula 2, b' and c' may be an integer of 0 to 4. When b' is 2 or more, a plurality of $R_2$'s may be the same as or different from each other, and when c' is 2 or more, a plurality of $R_3$'s may be the same as or different from each other.

In Formula 2, $Ar_1$, $Ar_2$, and $R_1$ to $R_3$ may each independently be the same as defined in Formula 1.

In an embodiment, Formula 2 may be represented by Formula 2-1 or Formula 2-2:

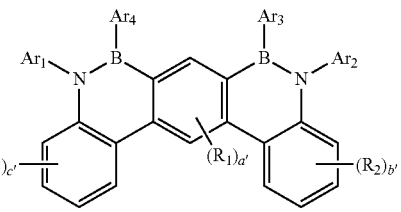

Formula 2-1

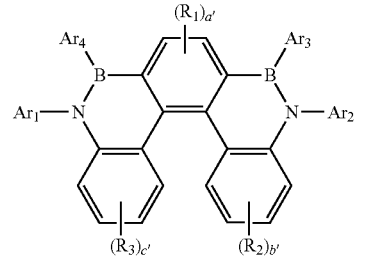

Formula 2-2

In Formulas 2-1 and 2-2, $Ar_1$ to $Ar_4$, $R_1$ to $R_3$, a', b', and c' may each independently be the same as defined in Formula 2.

In an embodiment, Formula 2 may be represented by Formula 2-3:

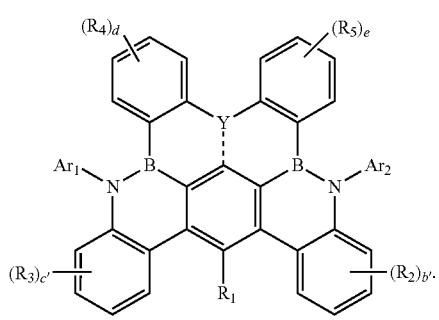

Formula 2-3

In Formula 2-3, Y may be $CR_6$, N, or O, and the dotted line refers to an optional bond, where when Y is $CR_6$ or N, the dotted line refers to a bond, and when Y is O, the bond along the dotted line is omitted.

In Formula 2-3, $R_4$ to $R_6$ may each independently be a hydrogen atom, a deuterium atom, a halogen atom, a nitro group, a cyano group, a hydroxy group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring.

In Formula 2-3, d and e may each independently be an integer of 0 to 4. When d is 2 or more, a plurality of $R_4$'s may be the same as or different from each other, and when e is 2 or more, a plurality of $R_5$'s may be the same as or different from each other.

In Formula 2-3, $Ar_1$, $Ar_2$, $R_1$ to $R_3$, b', and c' may each independently be the same as defined in Formula 2.

In an embodiment, Formula 1 may be represented by Formula 3:

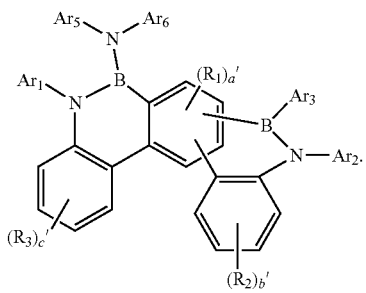

Formula 3

In Formula 3, $Ar_3$, $Ar_5$, and $Ar_6$ may each independently be a substituted or unsubstituted aryl group having 6 to 30 ring-forming carbon atoms, a substituted or unsubstituted heteroaryl group having 2 to 30 ring-forming carbon atoms, and/or bonded to an adjacent to form a ring.

In Formula 3, a' may be an integer of 0 to 2. When a' is 2, a plurality of $R_1$'s may be the same as or different from each other.

In Formula 3, b' and c' may be an integer of 0 to 4. When b' is 2 or more, a plurality of $R_2$'s may be the same as or different from each other, and when c' is 2 or more, a plurality of $R_3$'s may be the same as or different from each other.

In Formula 3, $Ar_1$, $Ar_2$, and $R_1$ to $R_3$ may be the same as defined in Formula 1.

In an embodiment, Formula 3 may be represented by Formula 3-1:

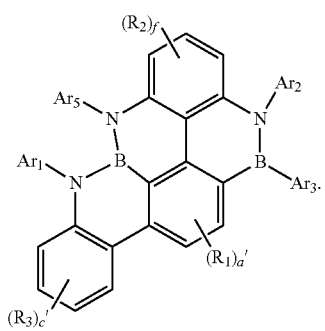

Formula 3-1

In Formula 3-1, f may be an integer of 0 to 3. When f is 2 or more, a plurality of $R_2$'s may be the same as or different from each other.

$Ar_1$ to $Ar_3$, $Ar_5$, $R_1$ to $R_3$, a', and c' may each independently be the same as defined in Formula 3.

In an embodiment, Formula 3-1 may be represented by Formula 3-2:

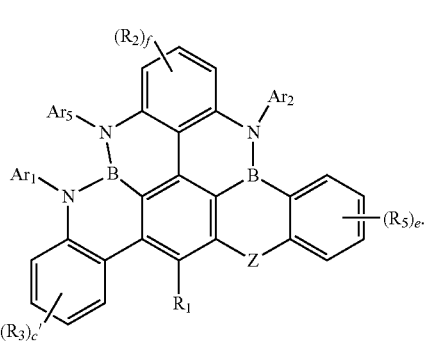

Formula 3-2

In Formula 3-2, Z may be $CR_7R_8$, $NR_9$, or O.

In Formula 3-2, $R_5$ and $R_7$ to $R_9$ may each independently be a hydrogen atom, a deuterium atom, a halogen atom, a nitro group, a cyano group, a hydroxy group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring.

In Formula 3-2, e may be an integer of 0 to 4. When e is 2 or more, a plurality of $R_5$'s may be the same as or different from each other.

In Formula 3-2, $Ar_1$, $Ar_2$, $Ar_5$, $R_1$ to $R_3$, c', and f may each independently be the same as defined in Formula 3-1.

In an embodiment, Formula 1 may be represented by Formula 4:

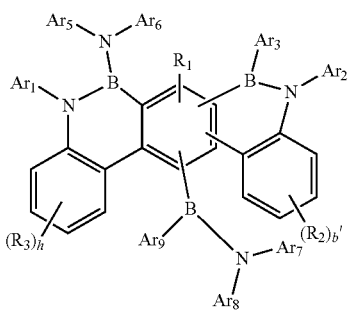

Formula 4

In Formula 4, $Ar_3$ and $Ar_5$ to $Ar_9$ may each independently be a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring.

In Formula 4, b' and c' may each independently be an integer of 0 to 4. When b' is 2 or more, a plurality of $R_2$'s may be the same as or different from each other, and when c' is 2 or more, a plurality of $R_3$'s may be the same as or different from each other.

In Formula 4, $Ar_1$, $Ar_2$, and $R_1$ to $R_3$ may each independently be the same as defined in Formula 1.

In an embodiment, Formula 4 may be represented by Formula 4-1:

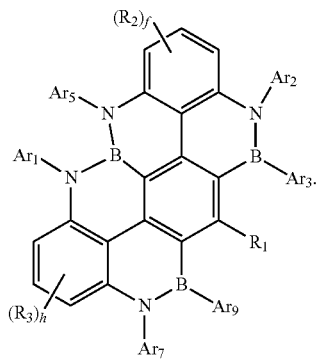

Formula 4-1

In Formula 4-1, f and h may each independently be an integer of 0 to 3. When f is 2 or more, a plurality of $R_2$'s may be the same as or different from each other, and when h is 2 or more, a plurality of $R_3$'s may be the same as or different from each other.

In Formula 4-1, $Ar_1$ to $Ar_3$, $Ar_5$, $Ar_7$, $Ar_9$, and $R_1$ to $R_3$ may each independently be the same as defined in Formula 4.

In an embodiment, Formula 4-1 may be represented by Formula 4-2:

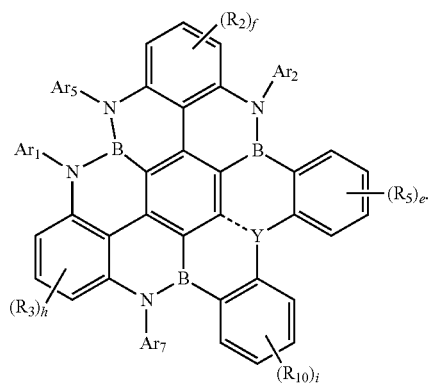

Formula 4-2

In Formula 4-2, Y may be $CR_6$, N, or O, the dotted line may refer to an optional bond, where when Y is $CR_6$ or N, the dotted line refers to a bond, and when Y is O, the bond along the dotted line is omitted.

In Formula 4-2, $R_5$, $R_6$, and $R_{10}$ may each independently be a hydrogen atom, a deuterium atom, a halogen atom, a nitro group, a cyano group, a hydroxy group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring.

In Formula 4-2, e and i may each independently be an integer of 0 to 4. When e is 2 or more, a plurality of $R_5$'s may be the same as or different from each other, and when i is 2 or more, a plurality of $R_{10}$'s may be the same as or different from each other.

In Formula 4-2, $Ar_1$, $Ar_2$, $Ar_5$, $Ar_7$, $R_2$, $R_3$, f, and h may each independently be the same as defined in Formula 4-1.

In an embodiment, the polycyclic compound represented by Formula 1 may be any one selected from the compounds represented by Compound Groups 1 to 3. However, embodiments of the present disclosure are not limited thereto.

Compound Group 1

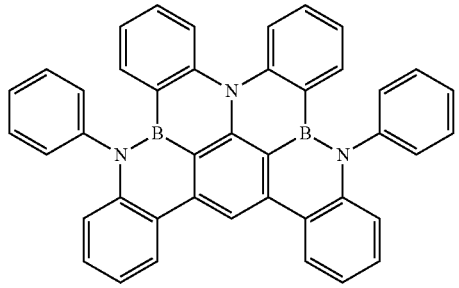

A-1

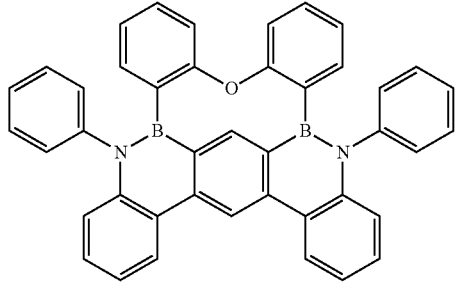

A-2

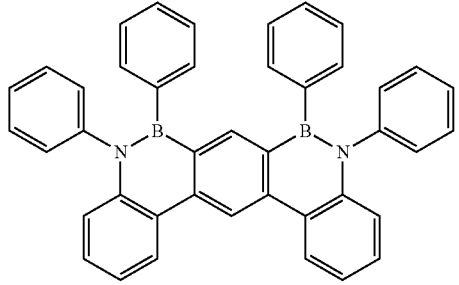

A-3

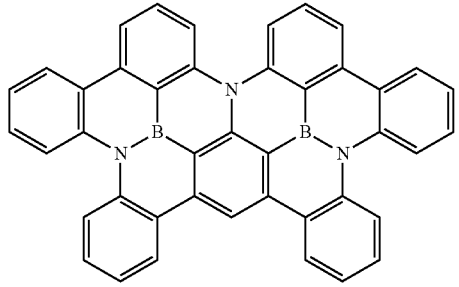

A-4

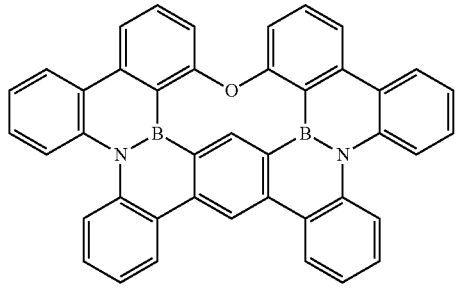

A-5

A-6
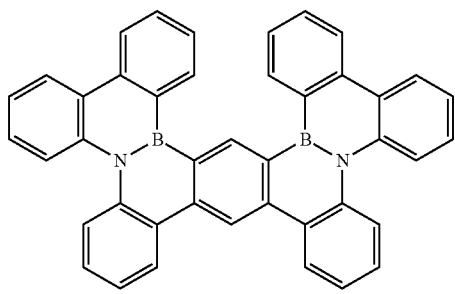
A-7
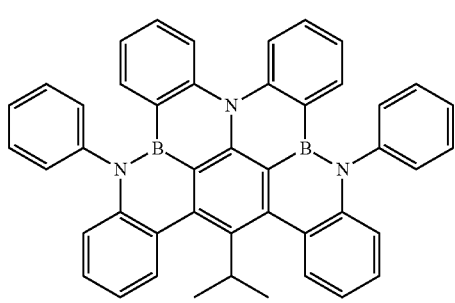
A-8
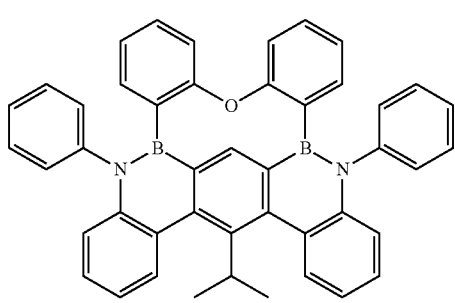
A-9
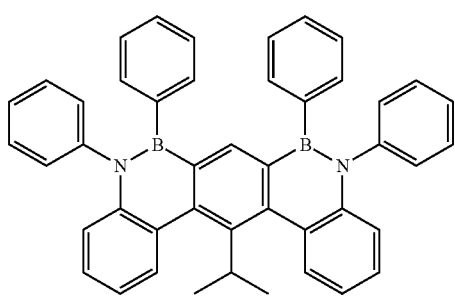
A-10
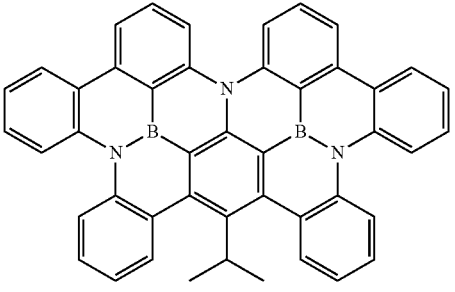
A-11
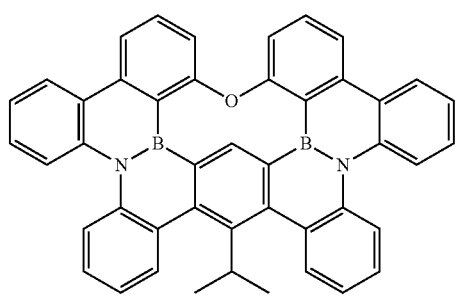
A-12
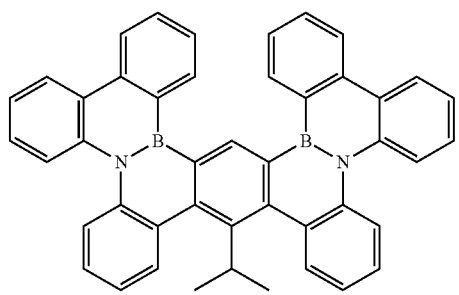
A-13
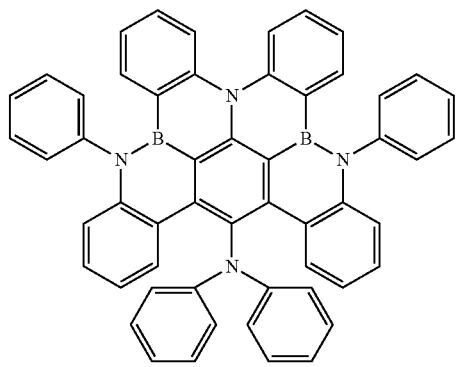
A-14
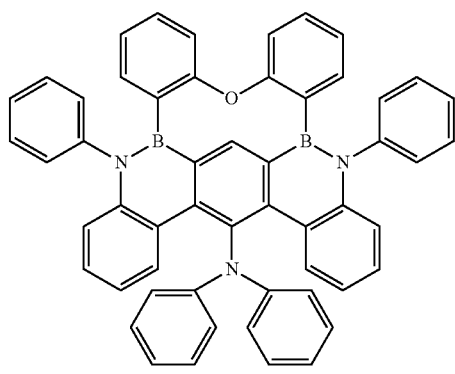

A-15

A-16

A-17

A-18

A-1'

Compound Group 2

B-1

B-2

B-3

-continued
B-4
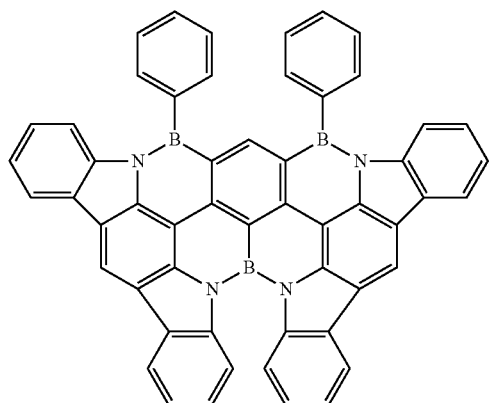
B-5
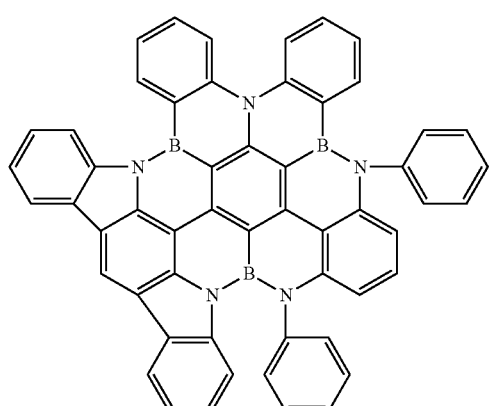
B-6
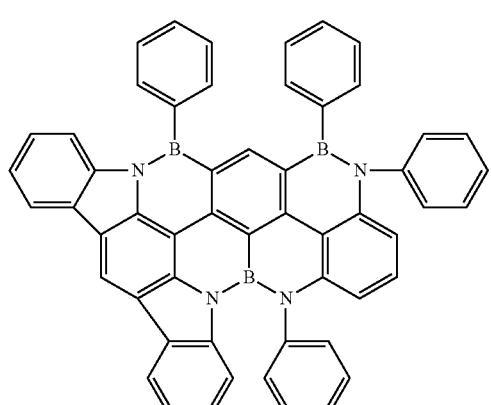
B-7
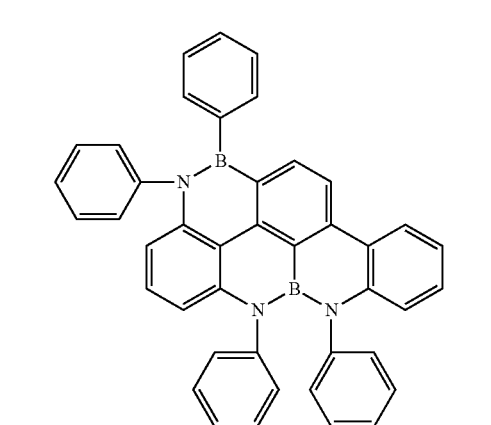
B-8
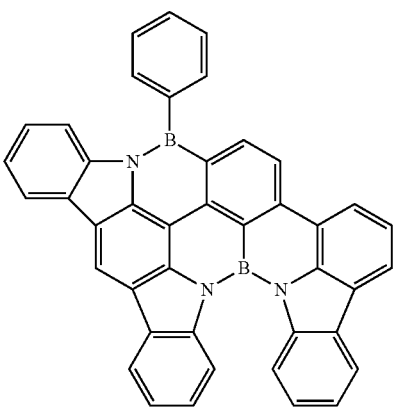
B-9
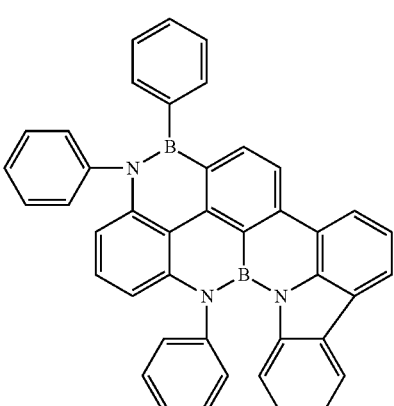
B-10
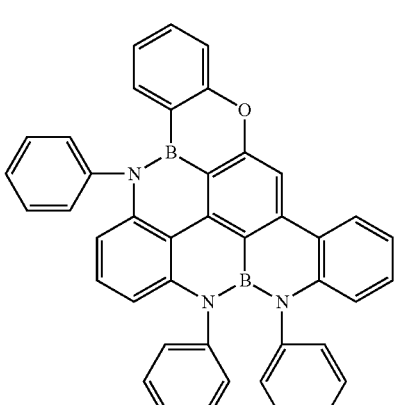
B-11
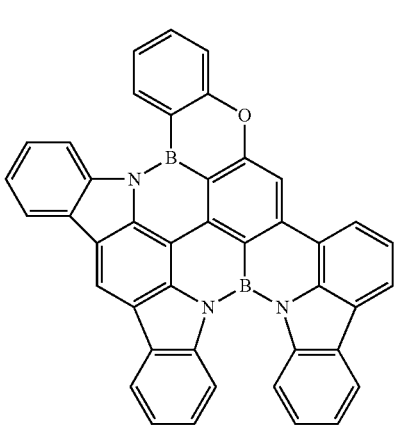

-continued
B-12
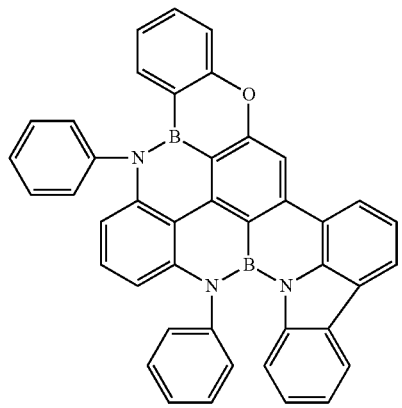
B-13
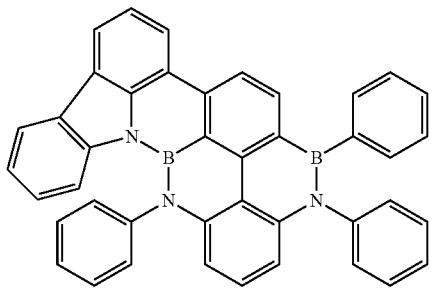
B-14
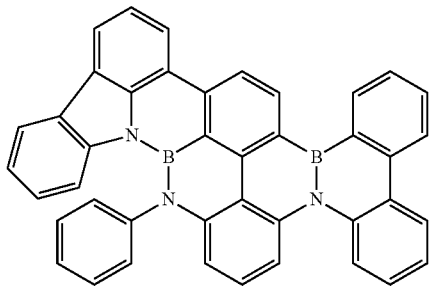
B-15
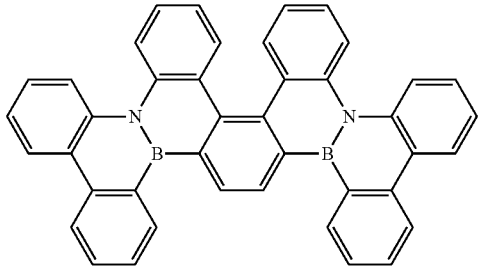
-continued
B-16
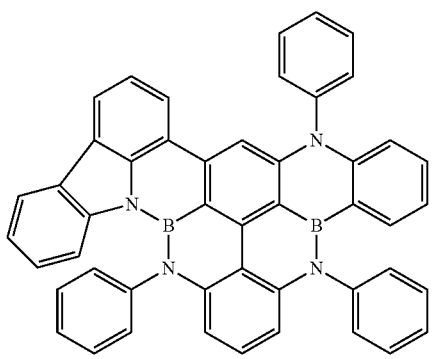
B-17
B-18
Compound Group 3
C-1
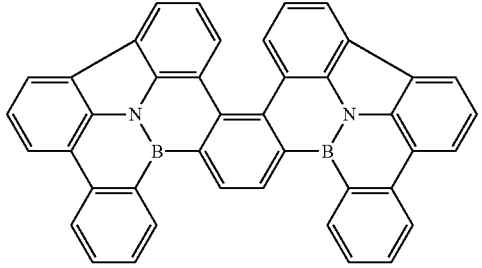
C-2

C-3
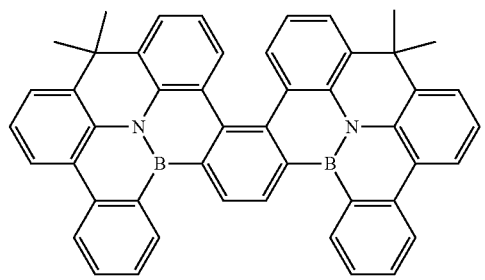
C-4
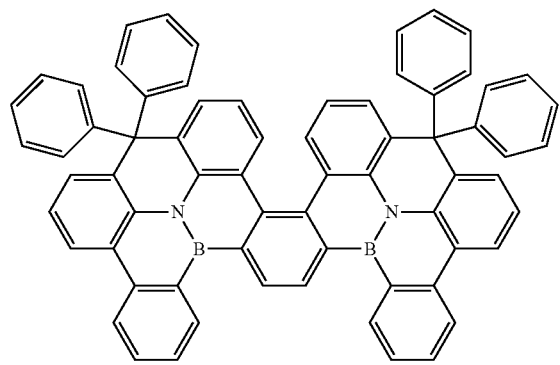
C-5
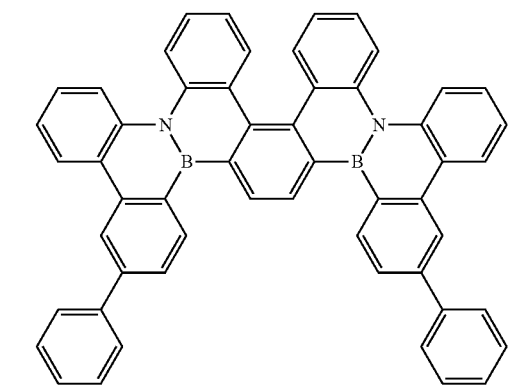
C-6
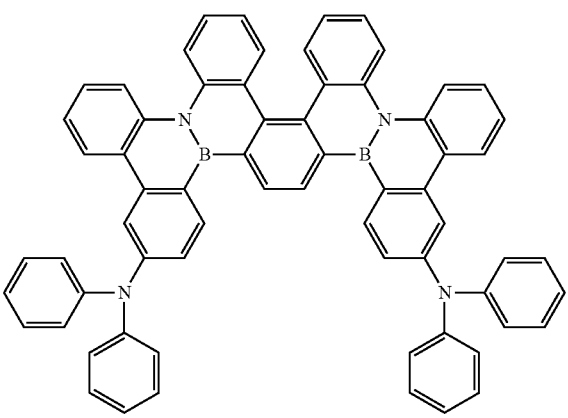
C-7
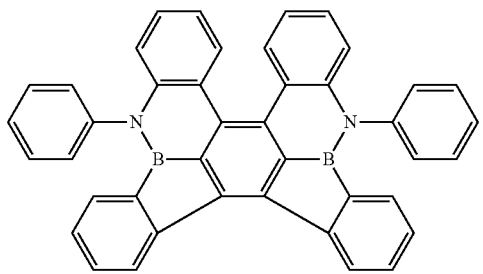
C-8
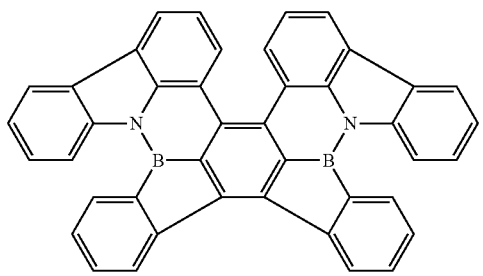
C-9
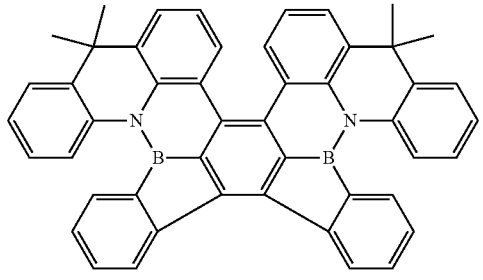
C-10
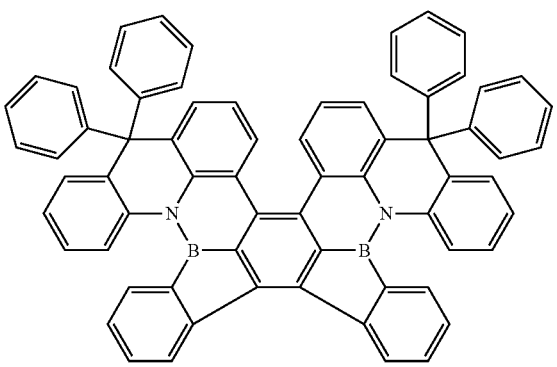
C-11
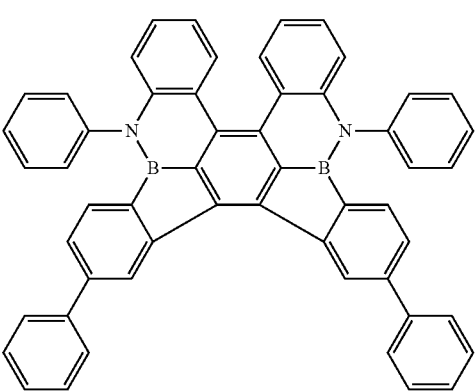

C-12
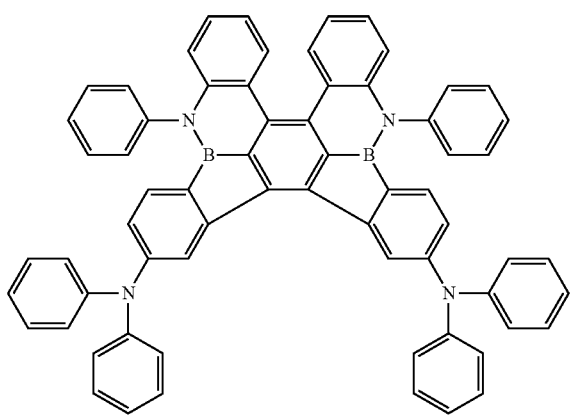
C-16
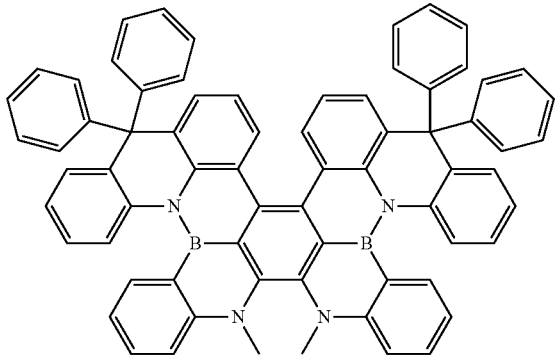
C-13
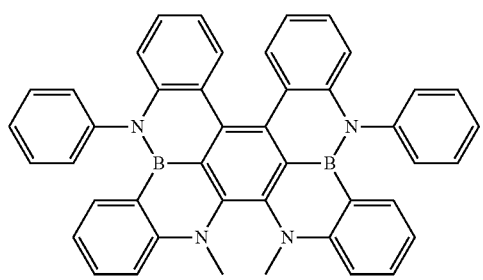
C-17
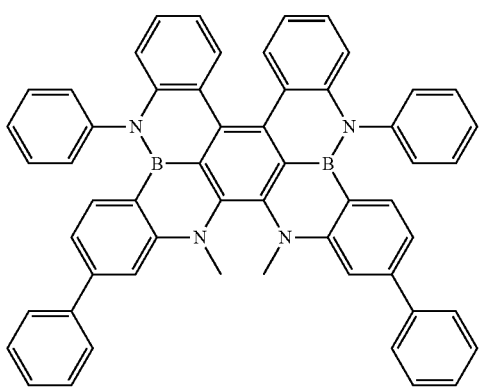
C-14
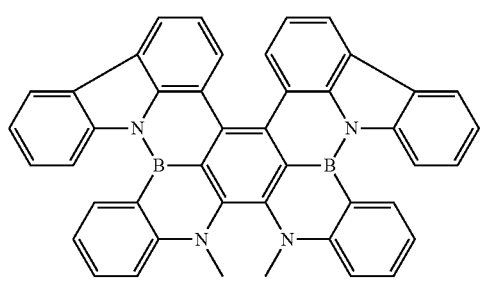
C-18
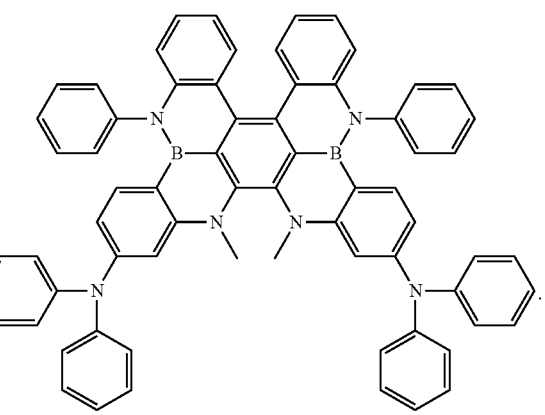
C-15
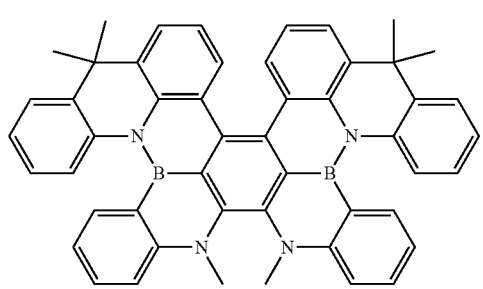
In an embodiment, the compounds represented by the Compound Groups 1 to 3 may each independently be substituted with a deuterium atom at any hydrogen atom position. For example, A-13 may be represented by A-13′:

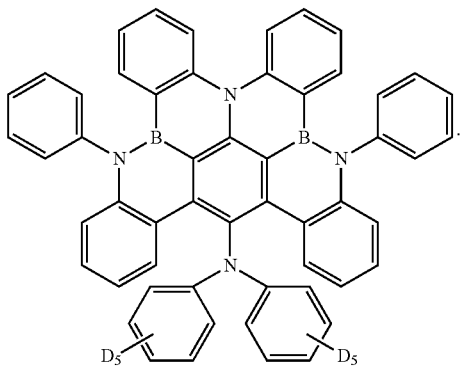

A-13'

The polycyclic compound described above may be used in an organic electroluminescence device 10 of an embodiment to improve the efficiency and lifespan of an organic electroluminescence device. For example, the polycyclic compound described above may be used in an emission layer EML of the organic electroluminescence device 10 of an embodiment to improve the luminous efficiency and lifespan of the organic electroluminescence device.

In an embodiment, the emission layer EML includes a host and a dopant, the host may be a host for delayed fluorescence emission, and the dopant may be a dopant for delayed fluorescence emission. In some embodiments, the polycyclic compound of an embodiment represented by Formula 1 may be included as a dopant material of the emission layer EML. For example, the polycyclic compound represented by Formula 1 may be used as a TADF dopant.

In some embodiments, the organic electroluminescence device 10 of an embodiment may include a plurality of emission layers. The plurality of emission layers may be sequentially stacked and provided, for example, the organic electroluminescence device 10 including the plurality of emission layers may be to emit white light. The organic electroluminescence device including a plurality of emission layers may be an organic electroluminescence device having a tandem structure. When the organic electroluminescence device 10 includes a plurality of emission layers, at least one emission layer EML may include the polycyclic compound according to the present disclosure as described above.

The emission layer EML may further include a dopant, and the dopant may use any suitable material. For example, at least one selected from styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), perylene and derivatives thereof (for example, 2,5,8,11-tetra-t-butylperylene (TBPe)), pyrene and derivatives thereof (for example, 1,1-dipyrene, 1,4-dipyrenylbenzene, 1,4-bis(N,N-diphenylamino)pyrene, and 1,6-bis(N,N-diphenylamino)pyrene), 2,5,8,11-tetra-t-butylperylene (TBP), and/or 1,3,5-tris(N-phenylbenzimidazole-2-yl)benzene (TPBi) may be used as a dopant, but embodiments of the present disclosure are not limited thereto.

The emission layer EML may further include any suitable material available in the art as a host material. For example, the emission layer EML may include at least one of tris(8-hydroxyquinolino)aluminum ($Alq_3$), bis[2-(diphenylphosphino)phenyl]ether oxide (DPEPO), 4,4'-bis(N-carbazolyl)-1,1'-biphenyl (CBP), 1,3-Bis(carbazolyl-9-yl)benzene (mCP), 2,8-bis(diphenylphosphoryl)dibenzofuran (PPF), poly(N-vinylcarbazole) (PVK), 9,10-di(naphthalen-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzofuran (PPF), or 1,3,5-tris(N-phenylbenzimidazole-2-yl)benzene (TPBi), but is not limited thereto.

When the emission layer EML is to emit red light, the emission layer EML may further include, for example, a fluorescent material including PBD:Eu$(DBM)_3$(Phen) (tris(dibenzoylmethanato) phenanthroline europium) or perylene. When the emission layer EML is to emit red light, a dopant included in the emission layer EML may be, for example, a metal complex or organometallic complex (such as bis(1-phenylisoquinoline) acetylacetonate iridium (PIQIr(acac)), bis(1-phenylquinoline) acetylacetonate iridium (PQIr(acac)), tris(1-phenylquinoline) iridium (PQIr) and/or octaethylporphyrin platinum (PtOEP)), rubrene and derivatives thereof, and/or 4-dicyanomethylene-2-(p-dimethylaminostyryl)-6-methyl-4H-pyran (DCM) and derivatives thereof.

When the emission layer EML is to emit green light, the emission layer EML may further include a fluorescent material including, for example, tris(8-hydroxyquinolino) aluminum ($Alq_3$). When the emission layer EML is to emit green light, a dopant included in the emission layer EML may be, for example, a metal complex such as fac-tris(2-phenylpyridine) iridium ($Ir(ppy)_3$) or an organometallic complex, and coumarins and derivatives thereof.

When the emission layer EML is to emit blue light, the emission layer EML may further include a fluorescent material including any one selected from the group consisting of, for example, spiro-DPVBi, spiro-6P, distyryl-benzene (DSB), distyryl-arylene (DSA), polyfluorene-based polymer (PFO), and poly(p-phenylene vinylene)-based polymer (PPV). When the emission layer EML is to emit blue light, a dopant included in the emission layer EML may be, for example, a metal complex or an organometallic complex (such as $(4,6-F2ppy)_2Irpic$), or perylene and derivatives thereof.

In the organic electroluminescence device 10 of an embodiment illustrated in FIGS. 1 to 4, an electron transport region ETR is provided on the emission layer EML. The electron transport region ETR may include at least one of a hole blocking layer HBL, an electron transport layer ETL, or an electron injection layer EIL, but embodiments of the present disclosure are not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, or may have a single layer structure formed of an electron injection material and an electron transport material. In some embodiments, the electron transport region ETR may have a single layer structure formed of a plurality of different materials, or may have a structure in which an electron transport layer ETL/electron injection layer EIL and a hole blocking layer HBL/electron transport layer ETL/electron injection layer EIL are stacked in order from the emission layer EML, but is not limited thereto. The thickness of the electron transport region ETR may be, for example, about 1,000 Å to about 1,500 Å.

The electron transport region ETR may be formed using any suitable method (such as a vacuum deposition method, a spin coating method, a cast method, a Langmuir-Blodgett (LB) method, an inkjet printing method, a laser printing method, a laser induced thermal imaging (LITI) method, etc.)

When the electron transport region ETR includes the electron transport layer ETL, the electron transport region ETR may include an anthracene-based compound. However, embodiments of the present disclosure are not limited thereto, and the electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, bis[2-(diphenylphosphino)phenyl]ether oxide (DPEPO), 2-(4-(N-phenylbenzimidazolyl-1-ylphenyl)-9,10-dinaphthylanthracene, 1,3,5-tri(1-phenyl-1H-benz[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate (Bebq2), 9,10-di(naphthalene-2-yl)anthracene (ADN), or a mixture thereof. The thickness of the electron transport layer ETL may be about 100 Å to about 1,000 Å and may be, for example, about 150 Å to about 500 Å. When the thickness of the electron transport layer ETL satisfies the above-described range, satisfactory electron transport properties may be obtained without a substantial increase in driving voltage.

When the electron transport region ETR includes the electron injection layer EIL, the electron transport region ETR may be a halogenated metal (such as LiF, NaCl, CsF, RbCl, and/or RbI), a lanthanide metal (such as ytterbium (Yb)), a metal oxide (such as $Li_2O$ and/or BaO), or lithium quinolate (LiQ), but embodiments of the present disclosure are not limited thereto. The electron injection layer EIL may also be formed of a mixture material of an electron transport material and an insulating organo-metal salt. The organo-metal salt may be a material having an energy band gap of about 4 eV or more. In some embodiments, the organo-metal salt may include, for example, metal acetates, metal benzoates, metal acetoacetates, metal acetylacetonates, and/or metal stearates. The thickness of the electron injection layers EIL may be about 1 Å to about 100 Å, or about 3 Å to about 90 Å. When the thickness of the electron injection layers EIL satisfies the above-described range, satisfactory electron injection properties may be obtained without a substantial increase in driving voltage.

As described above, the electron transport region ETR may include a hole blocking layer HBL. The hole blocking layer HBL may include, for example, at least one of 2,9-dimethyl-4,7-diphenyl-1,10-phenanthroline (BCP), bis[2-(diphenylphosphino)phenyl]ether oxide (DPEPO), or 4,7-diphenyl-1,10-phenanthroline (Bphen), but is not limited thereto.

The second electrode EL2 is provided on the electron transport region ETR. The second electrode EL2 may be a common electrode or a cathode. The second electrode EL2 may be a transmissive electrode, a transflective electrode, or a reflective electrode. When the second electrode EL2 is a transmissive electrode, the second electrode EL2 may include a transparent metal oxide, for example, indium tin oxide (ITO), indium zinc oxide (IZO), zinc oxide (ZnO), or indium tin zinc oxide (ITZO).

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). In some embodiments, the second electrode EL2 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc.

In some embodiments, the second electrode EL2 may be connected with an auxiliary electrode. When the second electrode EL2 is connected with an auxiliary electrode, the resistance of the second electrode EL2 may decrease.

Referring to FIG. 4, the organic electroluminescence device 10 according to an embodiment may further include a capping layer CPL on the second electrode EL2. The capping layer CPL may include, for example, α-NPD, NPB, TPD, m-MTDATA, Alq3, CuPc, N4,N4,N4',N4'-tetra(biphenyl-4-yl) biphenyl-4,4'-diamine (TPD15), 4,4',4"-tris(carbazol-9-yl)triphenylamine (TCTA), N, N'-bis(naphthalen-1-yl), etc.

The organic electroluminescence device 10 according to an embodiment of the present disclosure may include a polycyclic compound represented by Formula 1 as described above to obtain superior luminous efficiency and long-life characteristics. In addition, the organic electroluminescence device 10 according to an embodiment may achieve high efficiency and long-life characteristics in a blue wavelength region.

Hereinafter, a compound according to an embodiment of this present disclosure and an organic electroluminescence device of an embodiment will be described in more detail with reference to Examples and Comparative Examples. The Examples shown below are illustrated only for the understanding of this present disclosure, and the scope of the present disclosure is not limited thereto.

EXAMPLES

Synthesis of Polycyclic Compounds

Example synthesis methods for a polycyclic compound according to embodiments of the present disclosure are described below, but not limited thereto.

1. Synthesis of Compound A-1

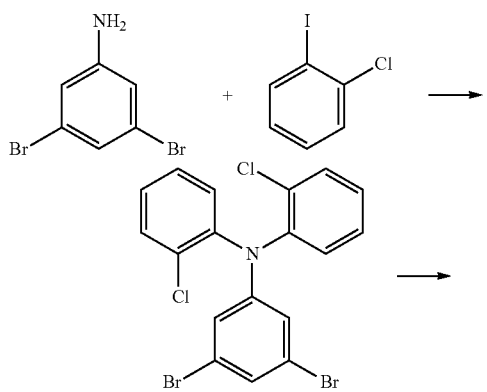

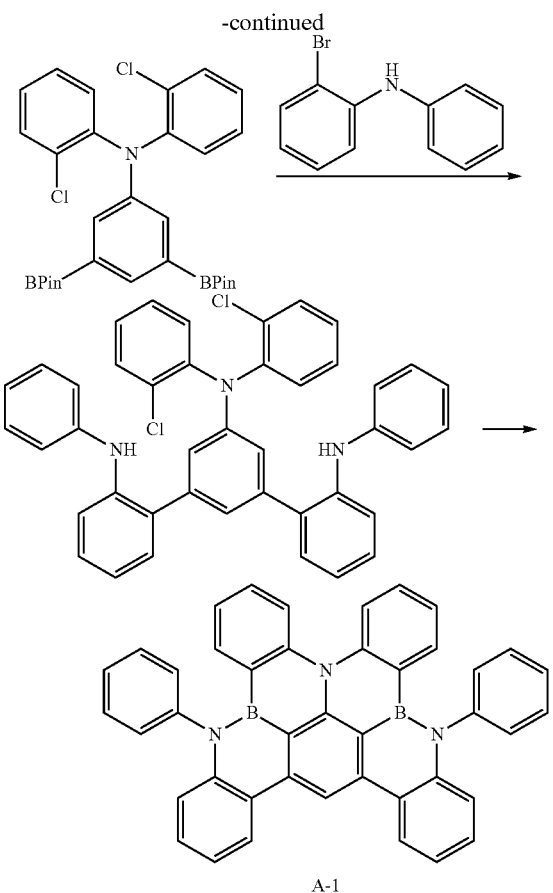

A-1

A toluene (400 mL) solution of 3,5-dibromoaniline (20 g), 1-chloro-2-iodobenzene (57 g), sodium butoxide (23 g), $Pd_2(dba)_3$ (1.5 g), and $PH(tBu)_3/BF_4$ (1.8 g) was heated to reflux for 6 hours using oil bath heating. After cooling to room temperature, the reaction solution was poured into water. The target product was extracted with ethyl acetate, dried over magnesium sulfate, and then concentrated under reduced pressure. The resulting mixture was purified by silica gel chromatography to obtain Intermediate 1 (13.5 g, yield: 36%).

A 1,4-dioxane (300 mL) solution of bis-pinacol diborane (22 g), potassium phosphate (16.8 g) and $PdCl_2(dppf)$ (2 g) was added to Intermediate 1 (13.5 g) obtained above and heated to reflux for 3 hours using oil bath heating. After cooling to room temperature, the reaction solution was poured into water. The target product was extracted with ethyl acetate, dried over magnesium sulfate, and then concentrated under reduced pressure. The resulting mixture was purified by silica gel chromatography to obtain Intermediate 2 (14.6 g, yield: 90%).

A mixture solution of toluene (60 mL), ethanol (15 mL), and water (15 mL) including 2-bromo-N-phenylaniline (5.6 g), potassium carbonate (3.7 g), and $PdCl_2(PPh_3)_2$ (0.2 g) was added to Intermediate 2 (4.3 g) obtained above and heated to reflux for 8 hours using oil bath heating. After cooling to room temperature, the reaction solution was poured into water. The target product was extracted with ethyl acetate, dried over magnesium sulfate, and then concentrated under reduced pressure. The resulting mixture was purified by silica gel chromatography to obtain Intermediate 3 (2.1 g, yield: 43%).

A t-butylbenzene (20 mL) solution of Intermediate 3 (2.1 g) obtained above was cooled to −78° C. t-BuLi/pentane (10 mL) was added thereto and stirred at 60° C. for 1 hour. Then, the solution was cooled to −50° C., and a solution of $BBr_3$ (1 M in heptane, 9 mL) was added dropwise and stirred at room temperature for 3 hours. The solution was further cooled to −40° C., diisopropylethylamine (2.7 mL) was added dropwise and heated and stirred at 180° C. for 8 hours, and then the reaction mixture was returned to room temperature. The target product was extracted with ethyl acetate, dried over magnesium sulfate, and then concentrated under reduced pressure. The obtained mixture was purified by silica gel chromatography to obtain a target product, A-1 (0.6 g, yield: 30%). It was confirmed that the molecular weight of the target product was 595 as measured by FAB-MS. The obtained target product was further subjected to sublimation purification to obtain a sample for evaluation.

2. Synthesis of Compound B-1

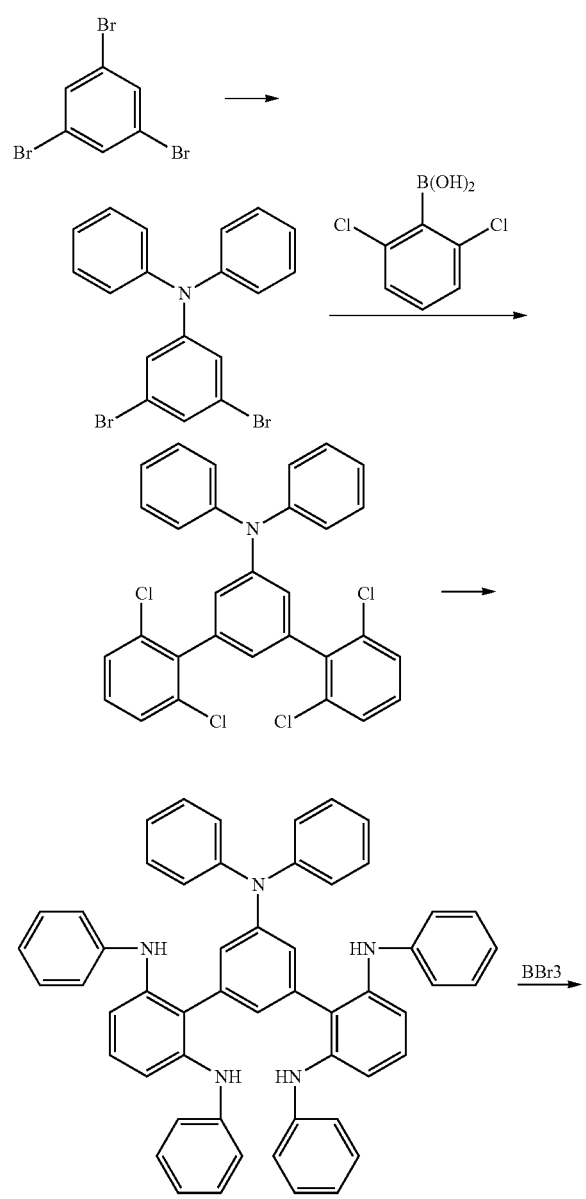

-continued

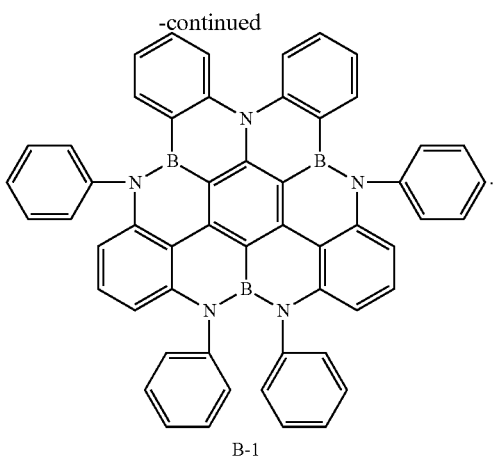

B-1

A toluene (100 mL) solution of 1,3,5-tribromobenzene (10 g), diphenylamine (5.9 g), sodium butoxide (6.7 g), Pd$_2$(dba)$_3$ (0.5 g), and xantPhos (0.6 g) was heated to reflux for 5 hours using oil bath heating. After cooling to room temperature, the reaction solution was poured into water. The target product was extracted with toluene, dried over magnesium sulfate, and then concentrated under reduced pressure. The obtained mixture was purified by silica gel chromatography to obtain Intermediate 1 (10 g, yield: 80%).

A mixture solution of toluene (200 mL), ethanol (100 mL), and water (100 mL) including 2,6-dichlorophenylboronic acid (14.2 g), potassium phosphate (35 g), and PdCl$_2$(dppf) (0.7 g) were added to Intermediate 1 (10 g) obtained above and heated to reflux for 3 hours using oil bath heating. After cooling to room temperature, the reaction solution was poured into water. The target product was extracted with toluene, dried over magnesium sulfate, and then concentrated under reduced pressure. The resulting mixture was purified by silica gel chromatography to obtain Intermediate 2 (12 g, yield: 90%).

A toluene (110 mL) solution of aniline (6.3 g), sodium butoxide (8.6 g), Pd$_2$(dba)$_3$ (0.4 g), and PH(tBu)$_3$/BF$_4$ (0.5 g) was added to Intermediate 2 (6 g) and heated to reflux for 10 hours using oil bath heating. After cooling to room temperature, the reaction solution was poured into water. The target product was extracted with ethyl acetate, dried over magnesium sulfate, and then concentrated under reduced pressure. The resulting mixture was purified by silica gel chromatography to obtain Intermediate 3 (8 g, yield: 94%).

1,2-dichlorobenzene (60 mL) including Intermediate 3 (6 g) obtained above was cooled to 0° C. BBr$_3$ (2.2 mL) and diisopropylethylamine (16.5 mL) were added dropwise and stirred at 190° C. for 8 hours. After cooling the reaction mixture to room temperature, the target product was extracted with toluene, dried over magnesium sulfate, and then concentrated under reduced pressure. The obtained mixture was purified by silica gel chromatography to obtain a target product, B-1 (2.1 g, yield: 34%). In addition, it was confirmed that the molecular weight of the target product was 785 as measured by FAB-MS. The obtained target product was further subjected to sublimation purification to obtain a sample for evaluation.

Manufacture of Organic Electroluminescence Devices

Organic electroluminescence devices according to Examples 1 and 2 were manufactured using the above-described Example Compound as an emission layer material.

Example Compounds

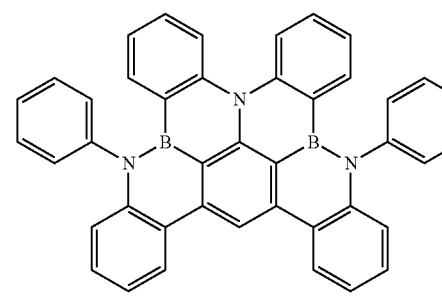

A-1

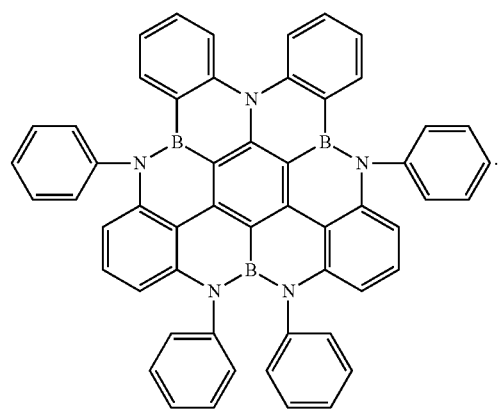

B-1

Organic electroluminescence devices according to Comparative Examples 1 to 3 were manufactured using Comparative Example Compounds X-1 to X-3 as an emission layer material.

Comparative Example Compounds

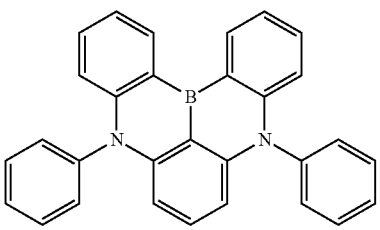

X-1

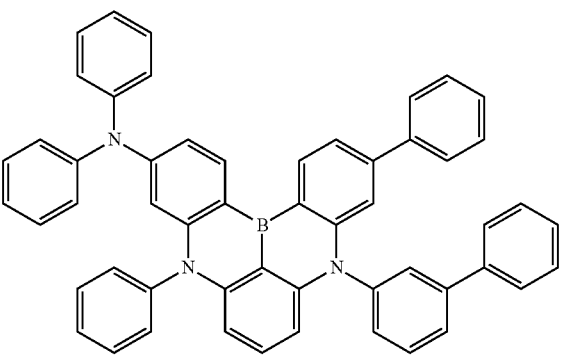

X-2

-continued

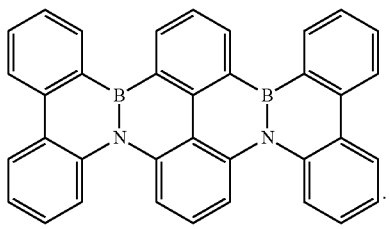
X-3

The organic electroluminescence devices of the Examples and Comparative Examples were manufactured by the following method. An ITO layer having a thickness of 1500 Å was patterned on a glass substrate, washed with ultrapure water, and UV ozone-treated for 10 minutes. Thereafter, HAT-CN was deposited to a thickness of 100 Å, α-NPD was deposited to a thickness of 800 Å, and mCP was deposited to a thickness of 50 Å to form a hole transport region.

Next, in the forming of an emission layer, a polycyclic compound or a comparative example compound and mCBP were co-deposited at 10:90 to form a layer having a thickness of 200 Å.

A layer having a thickness of 300 Å was formed of TPBi, and a layer having a thickness of 5 Å was formed of LiF on the emission layer to form an electron transport region. Next, a second electrode having a thickness of 1000 Å was formed of aluminum (Al).

Evaluation of Organic Electroluminescence Device Characteristics

The life spans of the organic electroluminescence devices according to Examples and Comparative Examples were measured. The reported life spans of the devices are relative to that of the device of Comparative Example 1 (which is set to 100%).

TABLE 1

| Device | Emission layer dopant | Device life (%) |
| --- | --- | --- |
| Example 1 | Example Compound A-1 | 165 |
| Example 2 | Example Compound B-1 | 158 |
| Comparative Example 1 | Comparative Example Compound X-1 | 100 |
| Comparative Example 2 | Comparative Example Compound X-2 | 118 |
| Comparative Example 3 | Comparative Example Compound X-3 | 47 |

Referring to the results of Table 1, when the polycyclic compound according to an embodiment is included in an emission layer, it is confirmed that the life span of the Example devices was improved compared to those of Comparative Examples.

Without being bound by the correctness of any explanation or theory, it is believe that the structure associated with Example Compounds 1 and 2 prevents or reduces structural change between the ground state and the excited state, for example because the B—N direct bond has a larger bond energy than a B—C bond, and thus, it is seen that the full width at half maximum (FWHM) is maintained within a narrow range, and the life spans of devices including the polycyclic compound are improved.

The Comparative Example compounds has emission wavelengths that were shorter than those of the Example Compounds by about 40 nm, and thus, it is seen that the energy balance with the surrounding materials was the cause to shorten the life.

The organic electroluminescence device of an embodiment may improve the life span of devices by using the polycyclic compound represented by Formula 1 as an emission layer material.

The organic electroluminescence device according to an embodiment of the present disclosure may obtain high efficiency and long life.

The polycyclic compound according to an embodiment of the present disclosure may improve the life and efficiency of an organic electroluminescence device.

Although the present disclosure has been described with reference to a preferred embodiment of the present disclosure, it will be understood that the present disclosure should not be limited to these preferred embodiments, but that various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims and equivalents thereof.

What is claimed is:
1. An organic electroluminescence device, comprising:
a first electrode;
a hole transport region on the first electrode;
an emission layer on the hole transport region;
an electron transport region on the emission layer; and
a second electrode on the electron transport region,
wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, or an oxide thereof, and
wherein the emission layer comprises a polycyclic compound represented by Formula 1-1:

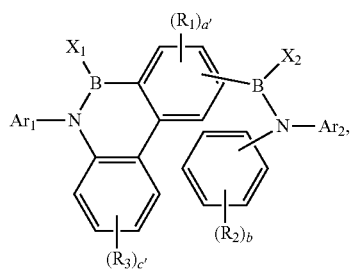

Formula 1-1 wherein in Formula 1-1,
$X_1$ and $X_2$ are each independently a substituted or unsubstituted arylamine group, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring,
$Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, R$_1$ to R$_3$ are each independently a hydrogen atom, a deuterium atom, a halogen atom, a nitro group, a cyano group, a hydroxy group, a substituted or unsubstituted boron group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, wherein one from a number of b R$_2$ groups is optionally a direct bond to the central benzene ring the two boron atoms are connected to, a' is an integer of 0 to 2, b is an integer of 0 to 5, and c' is an integer of 0 to 4, and wherein when i) the boron atom in B—X$_2$ is in para position to the boron atom in B—X$_1$, and ii) one R$_2$ is a direct bond to the central benzene ring the two boron atoms are connected to, the direct bond is in ortho position to the moiety represented by

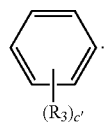

2. The organic electroluminescence device of claim 1, wherein the emission layer is to emit delayed fluorescence.

3. The organic electroluminescence device of claim 1, wherein the emission layer is a thermally activated delayed fluorescence emission layer to emit blue light.

4. The organic electroluminescence device of claim 1, wherein Formula 1-1 is represented by any one of Formulae 2 to 4:

Formula 2

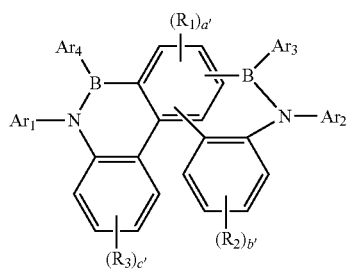

Formula 3

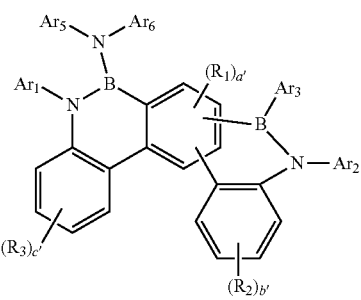

-continued

Formula 4

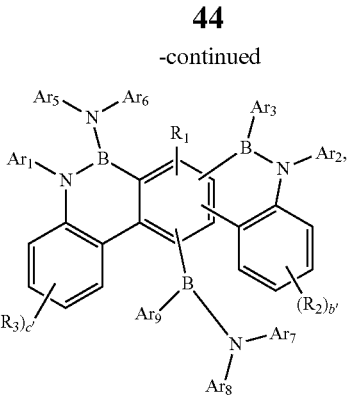

wherein in Formulae 2 to 4,

Ar$_3$ to Ar$_9$ are each independently a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, a' is an integer of 0 to 2, b' and c' are an integer of 0 to 4, and Ar$_1$, Ar$_2$, and R$_1$ to R$_3$ are each independently the same as defined in Formula 1-1.

5. The organic electroluminescence device of claim 4, wherein Formula 2 is represented by Formula 2-1 or Formula 2-2:

Formula 2-1

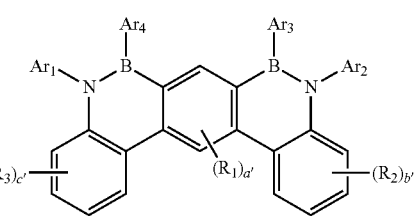

Formula 2-2

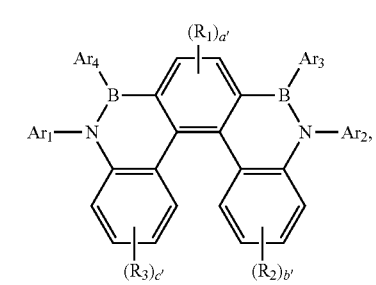

wherein in Formulae 2-1 and 2-2,

Ar$_1$ to Ar$_4$, R$_1$ to R$_3$, a', b', and c' are each independently the same as defined in Formula 2.

6. The organic electroluminescence device of claim 4, wherein Formula 2 is represented by Formula 2-3:

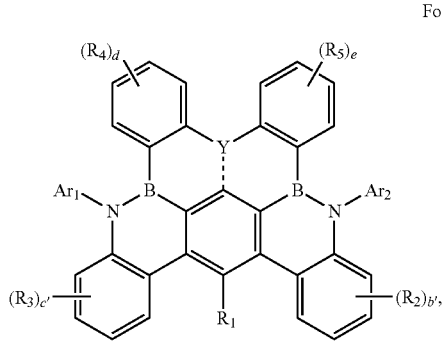

Formula 2-3 wherein in Formula 2-3,

Y is $CR_6$, N, or O, the dotted line is an optional bond, where when Y is $CR_6$ or N, the dotted line is a bond, and when Y is O, the bond along the dotted line is omitted, $R_4$ to $R_6$ are each independently a hydrogen atom, a deuterium atom, a halogen atom, a nitro group, a cyano group, a hydroxy group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted hetero aryl silyl group, and/or bonded to an adjacent group to form a ring, d and e are each independently an integer of 0 to 4, and $Ar_1$, $Ar_2$, $R_1$ to $R_3$, b', and c' are each independently the same as defined in Formula 2.

7. The organic electroluminescence device of claim 4, wherein Formula 3 is represented by Formula 3-1:

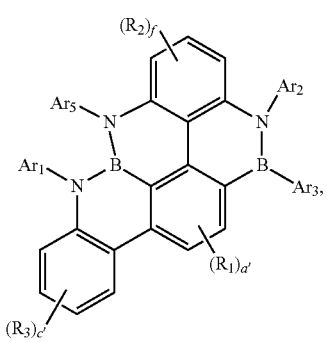

Formula 3-1 wherein in Formula 3-1, f is an integer of 0 to 3, and $Ar_1$ to $Ar_3$, $Ar_5$, $R_1$ to $R_3$, a', and c' are each independently the same as defined in Formula 3.

8. The organic electroluminescence device of claim 7, wherein Formula 3-1 is represented by Formula 3-2:

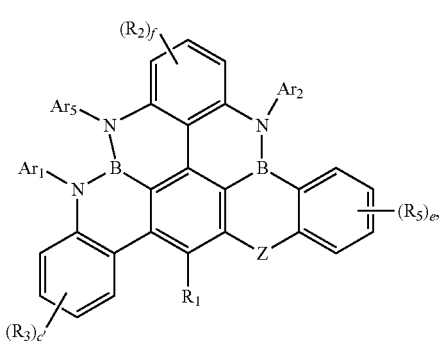

Formula 3-2 wherein in Formula 3-2,

Z is $CR_7R_8$, $NR_9$, or O, $R_5$ and $R_7$ to $R_9$ are each independently a hydrogen atom, a deuterium atom, a halogen atom, a nitro group, a cyano group, a hydroxy group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, e is an integer of 0 to 4, and $Ar_1$, $Ar_2$, $Ar_5$, $R_1$ to $R_3$, c', and f are each independently the same as defined in Formula 3-1.

9. The organic electroluminescence device of claim 4, wherein Formula 4 is represented by Formula 4-1:

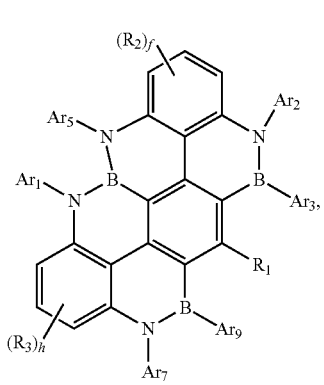

Formula 4-1 wherein in Formula 4-1, f and h are each independently an integer of 0 to 3, and $Ar_1$ to $Ar_3$, $Ar_5$, $Ar_7$, $Ar_9$, and $R_1$ to $R_3$ are each independently the same as defined in Formula 4.

10. The organic electroluminescence device of claim 9, wherein Formula 4-1 is represented by Formula 4-2:

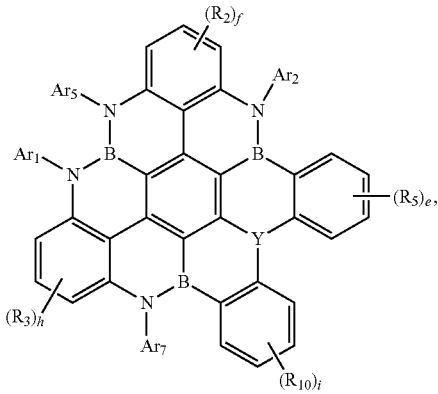

Formula 4-2 wherein in Formula 4-2,

Y is $CR_6$, N, or O, the dotted line is an optional bond, where when Y is $CR_6$ or N, the dotted line is a bond, and when Y is O, the bond along the dotted line is omitted, $R_5$, $R_6$, and $R_{10}$ are each independently a hydrogen atom, a deuterium atom, a halogen atom, a nitro group, a cyano group, a hydroxy group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, e and i are each independently an integer of 0 to 4, and $Ar_1$, $Ar_2$, $Ar_5$, $Ar_7$, $R_2$, $R_3$, f, and h are each independently the same as defined in Formula 4-1.

11. The organic electroluminescence device of claim 1, wherein $Ar_1$ and $Ar_2$ are each independently represented by Formula 5:

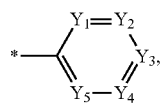

Formula 5 wherein in Formula 5, $Y_1$ to $Y_5$ are each independently CA or N, and

A is hydrogen, deuterium, or an alkyl group having 1 to 20 carbon atoms.

12. The organic electroluminescence device of claim 1, wherein at least one of $R_1$ to $R_3$ in Formula 1 is a deuterium atom, or comprises a deuterium atom as a substituent.

13. The organic electroluminescence device of claim 1, wherein the compound represented by Formula 1-1 is any one of the compounds represented by Compound Groups 1 to 3:

Compound Group 1

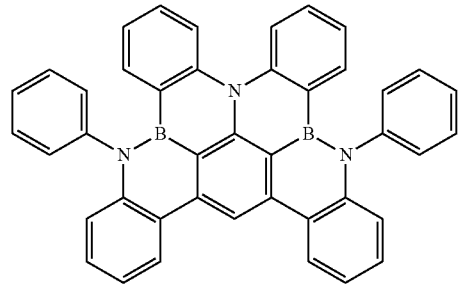

A-1

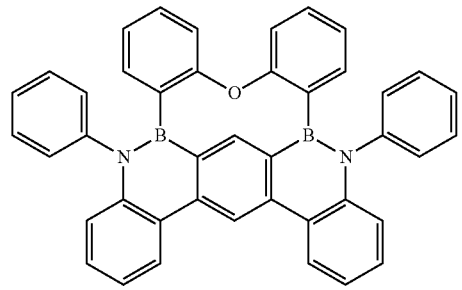

A-2

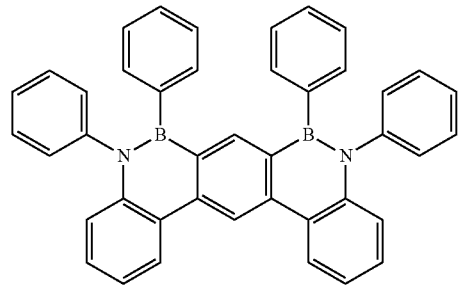

A-3

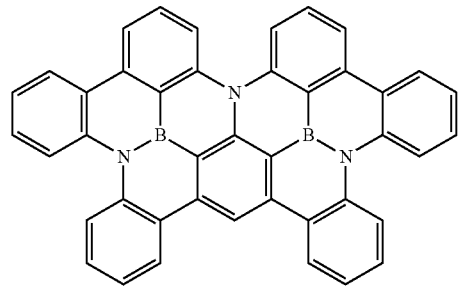

A-4

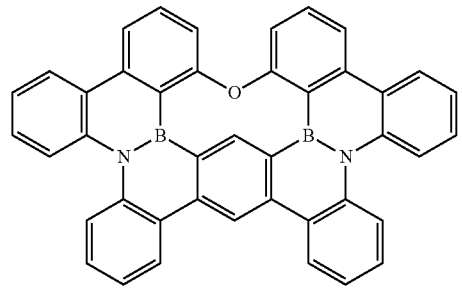

A-5

-continued
A-6
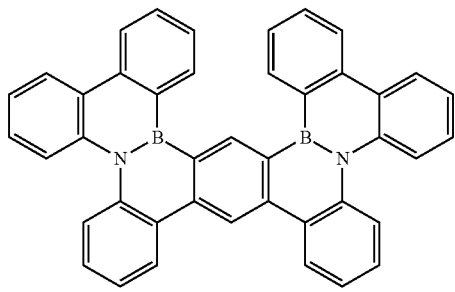
A-7
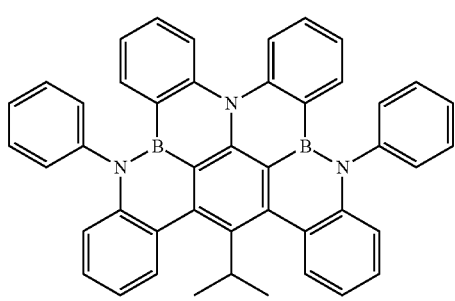
A-8
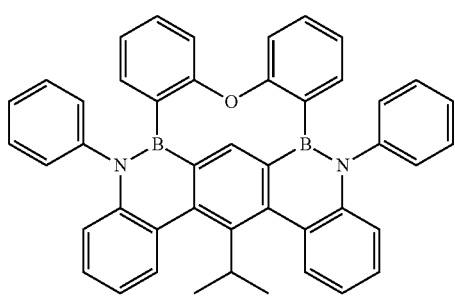
A-9
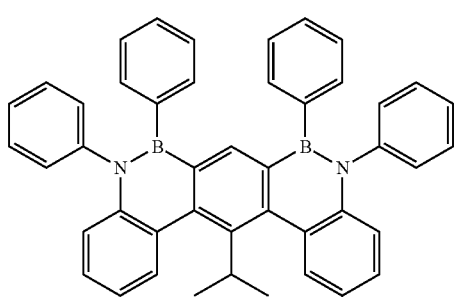
A-10
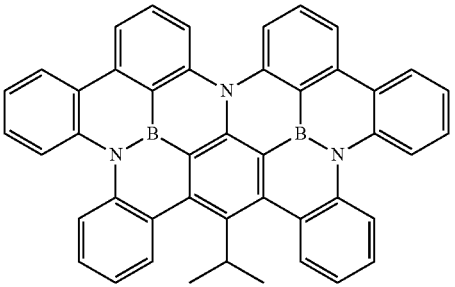
-continued
A-11
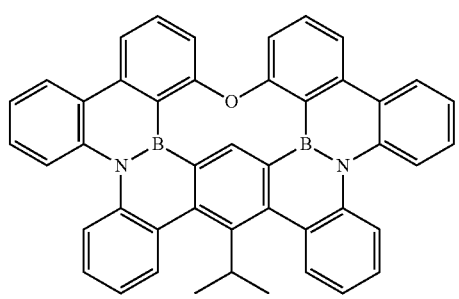
A-12
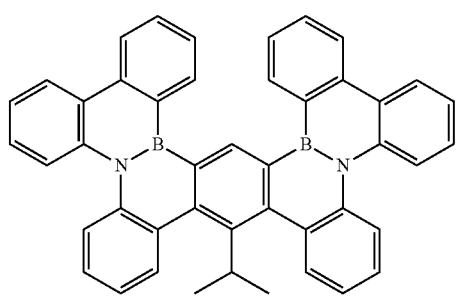
A-13
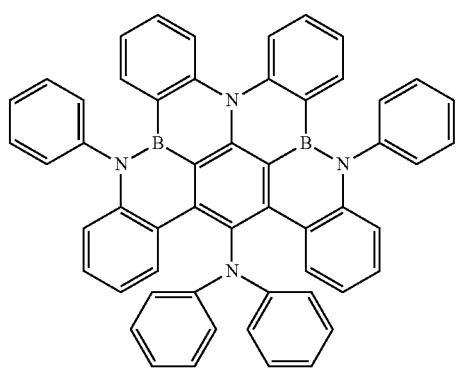
A-14
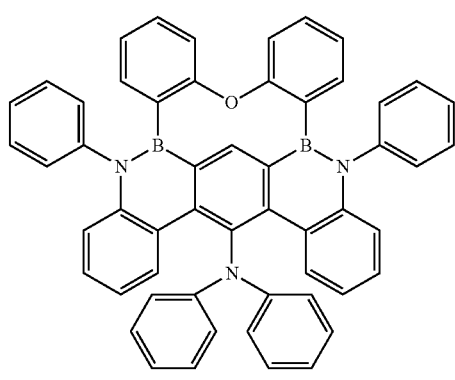

A-15
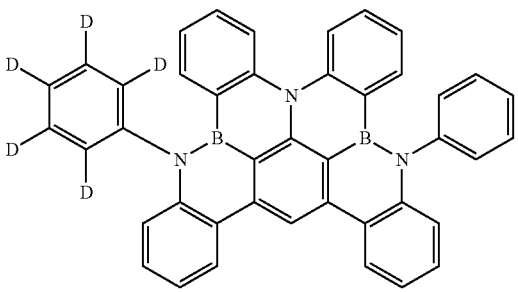
A-1'
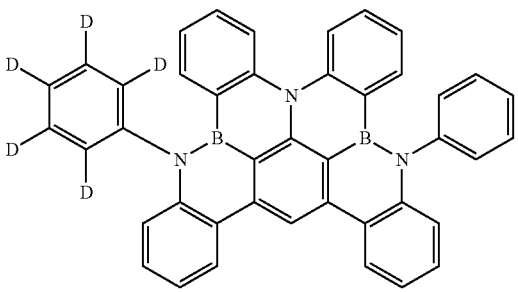
Compound Group 2
A-16
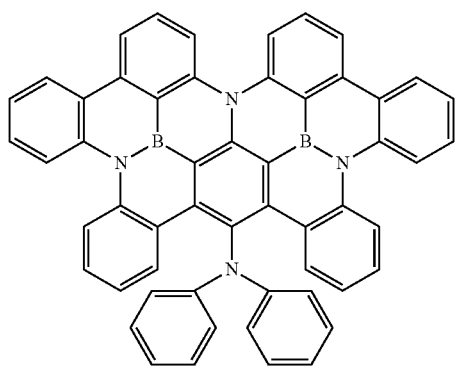
B-1
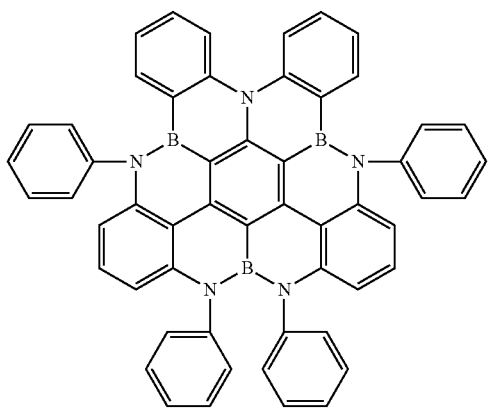
A-17
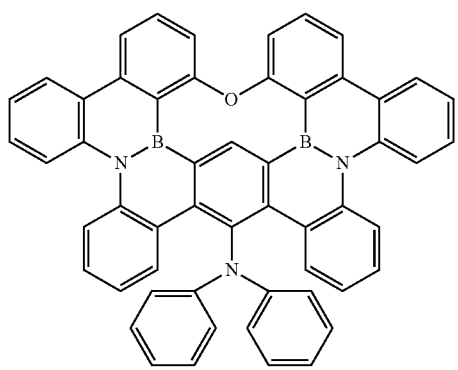
B-2
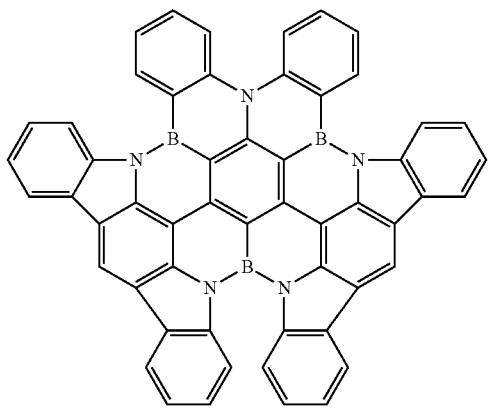
A-18
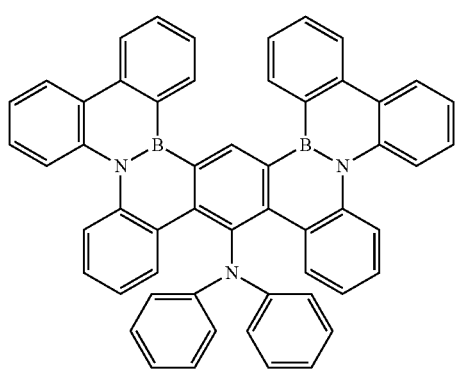
B-3
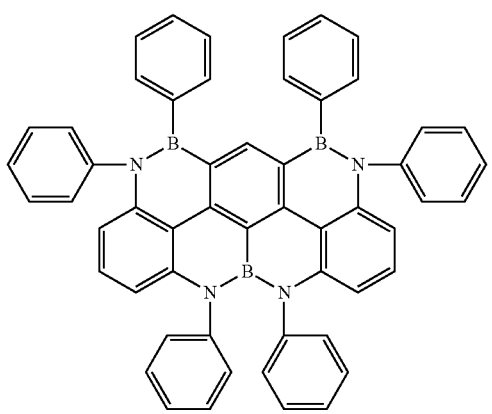

-continued
B-4
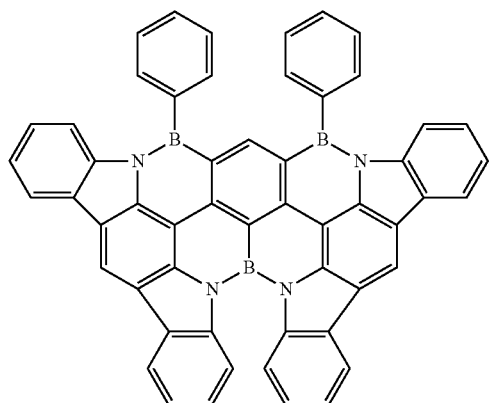
B-5
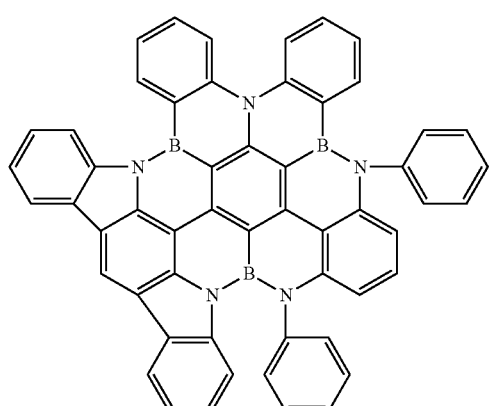
B-6
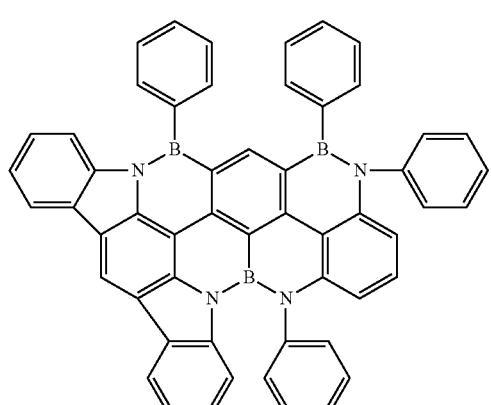
B-7
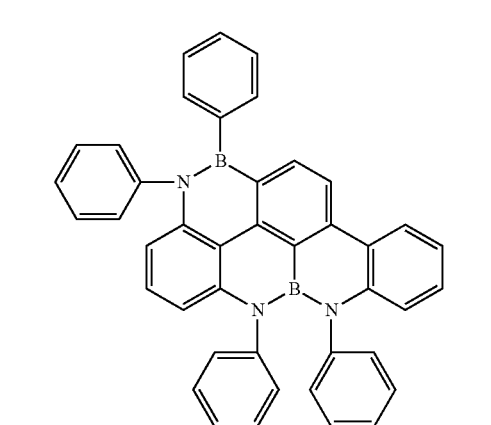
B-8
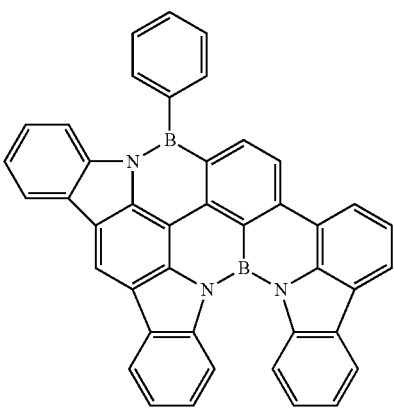
B-9
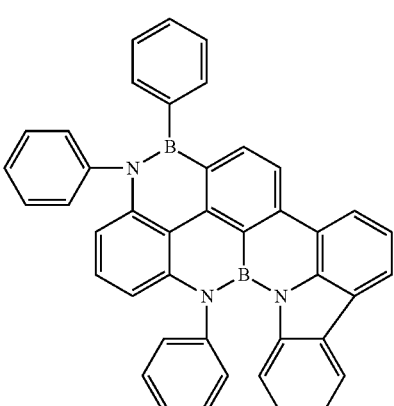
B-10
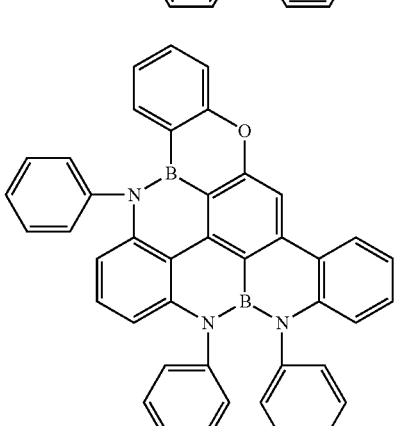
B-11
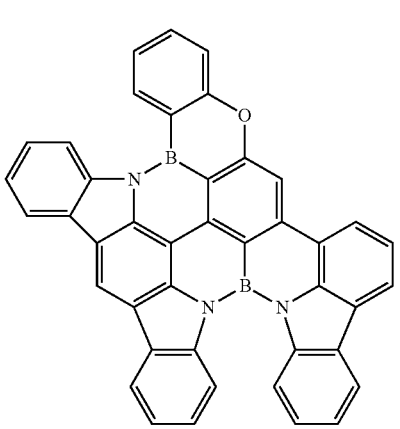

B-12
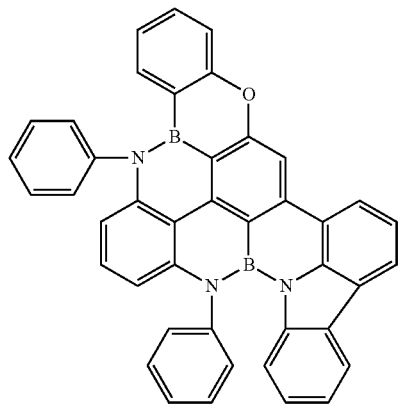
B-13
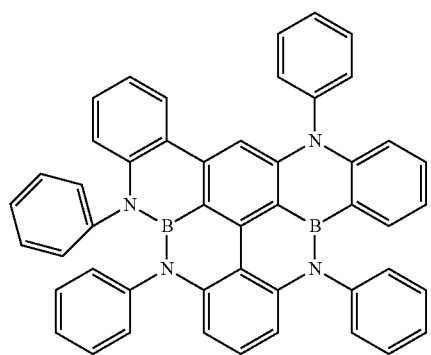
B-14
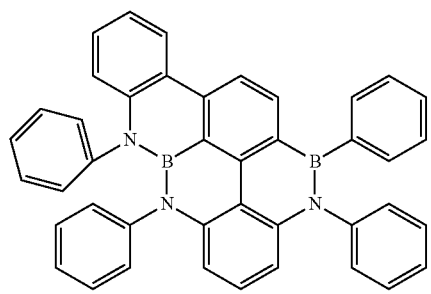
B-15
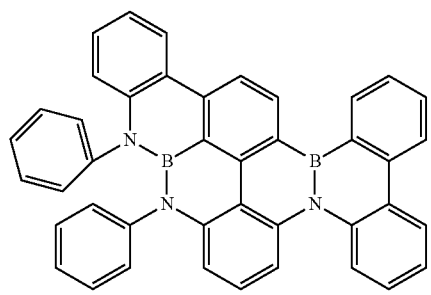
B-16
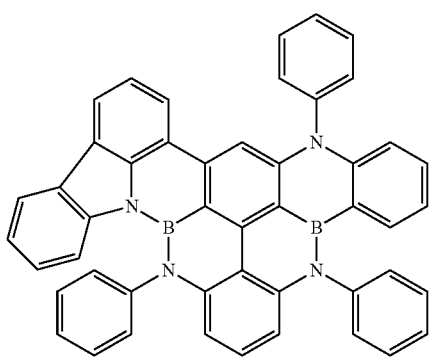
B-17
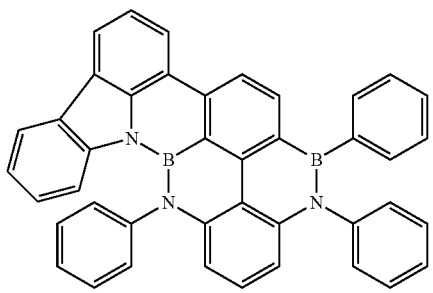
B-18
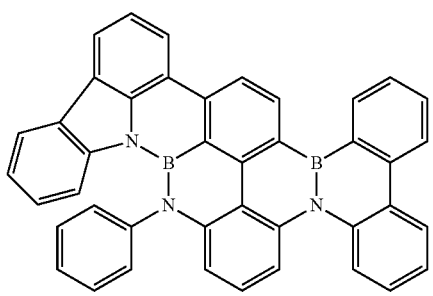
Compound Group 3
C-1
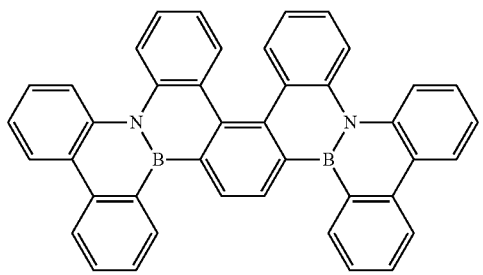
C-2
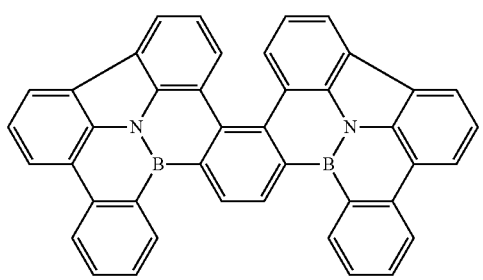

C-3
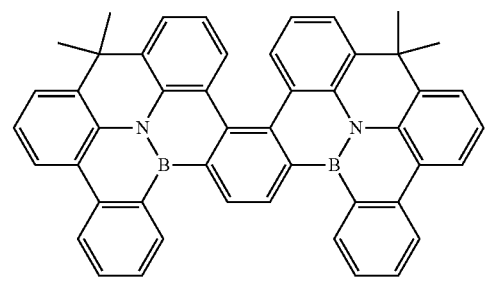
C-7
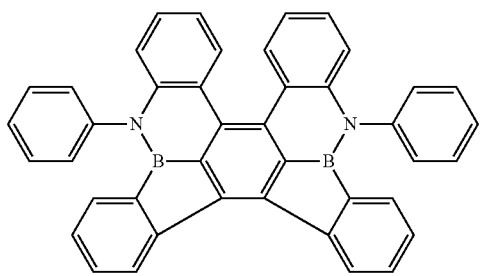
C-4
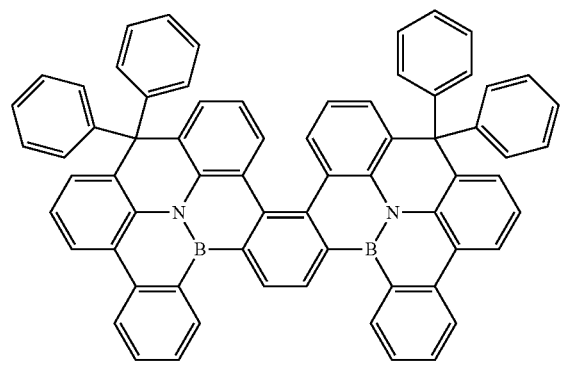
C-8
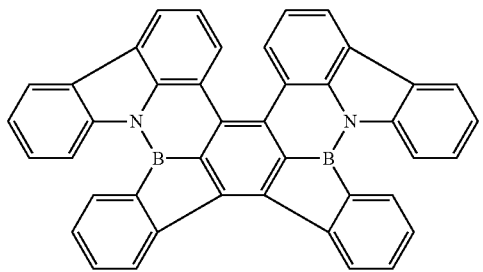
C-9
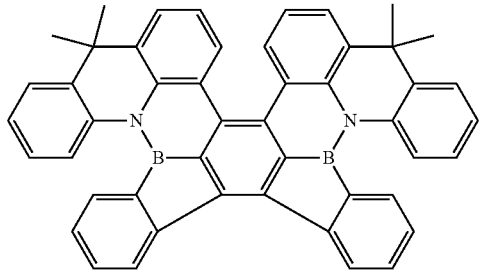
C-5
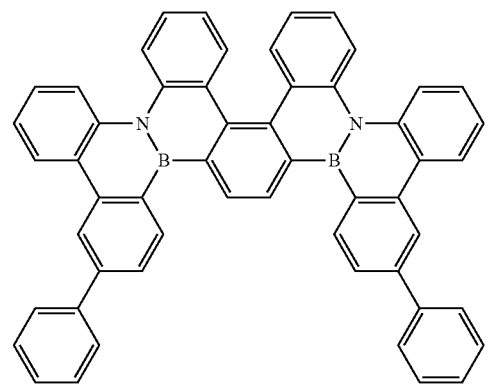
C-10
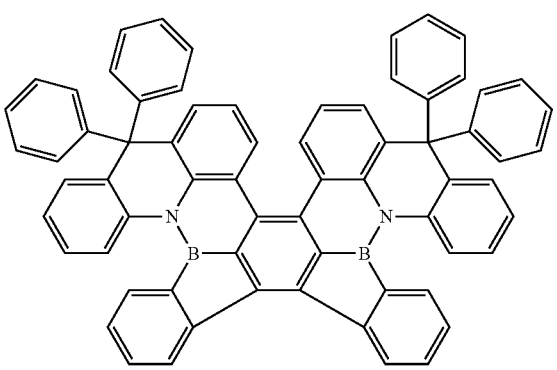
C-6
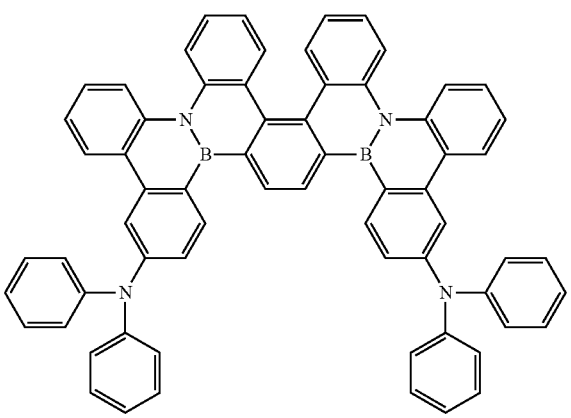
C-11
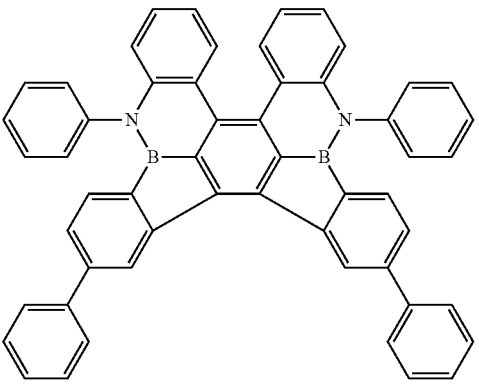

-continued
C-12
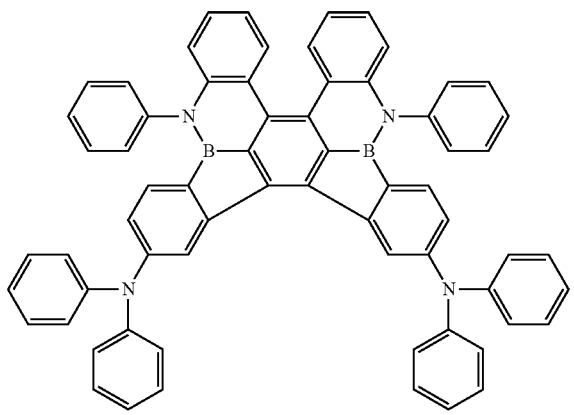
C-13
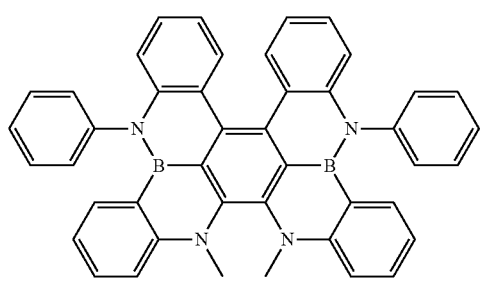
C-14
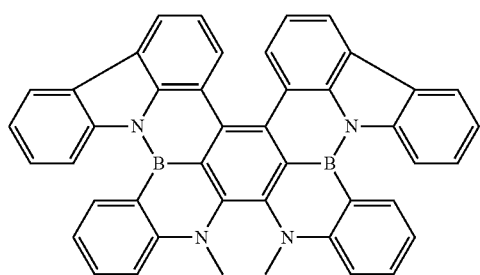
C-15
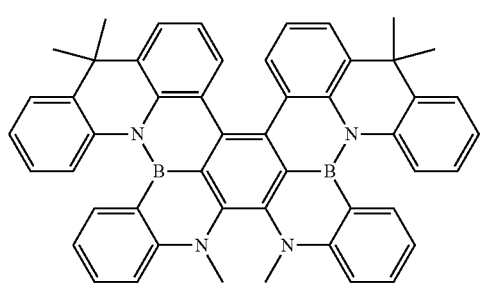
-continued
C-16
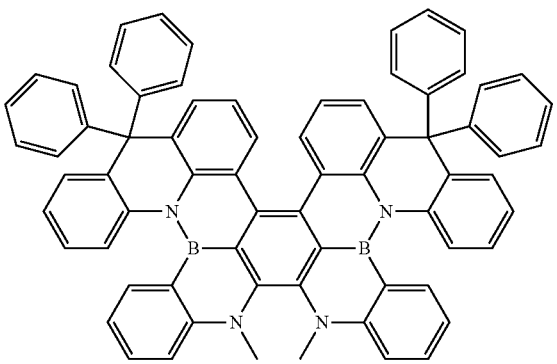
C-17
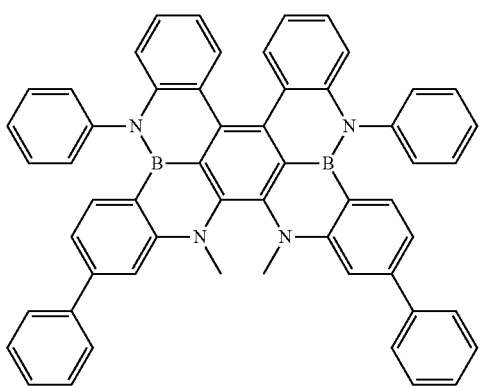
C-18
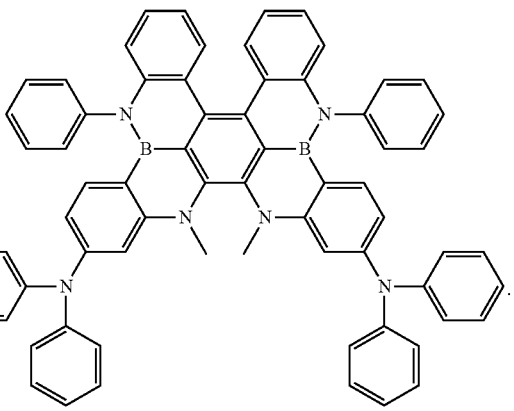
14. A polycyclic compound represented by Formula 1-1:
Formula 1-1
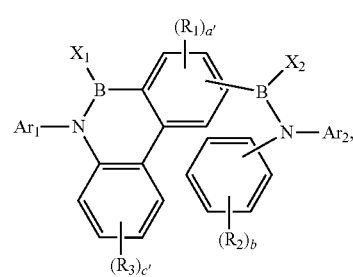

wherein in Formula 1-1,

X$_1$ and X$_2$ are each independently a substituted or unsubstituted arylamine group, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, Ar$_1$ and Ar$_2$ are each independently a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, R$_1$ to R$_3$ are each independently a hydrogen atom, a deuterium atom, a halogen atom, a nitro group, a cyano group, a hydroxy group, a substituted or unsubstituted boron group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, wherein one from a number of b R$_2$ groups is optionally a direct bond to the central benzene ring the two boron atoms are connected to, a' is an integer of 0 to 2, b is an integer of 0 to 5, and c' is an integer of 0 to 4, and wherein when i) the boron atom in B—X$_2$ is in para position to the boron atom in B—X$_1$, and ii) one R$_2$ is a direct bond to the central benzene ring the two boron atoms are connected to, the direct bond is in ortho position to the moiety represented by

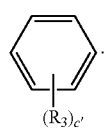

15. The polycyclic compound of claim 14, wherein Formula 1-1 is represented by any one of Formulae 2 to 4:

Formula 2

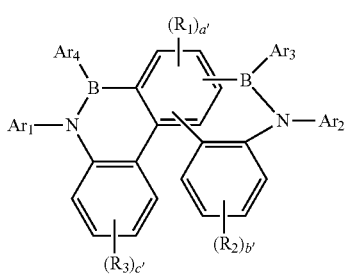

Formula 3

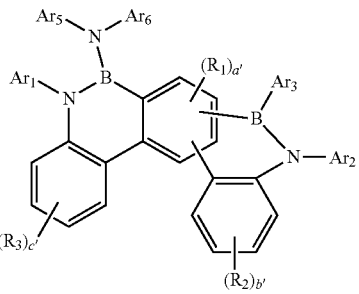

Formula 4

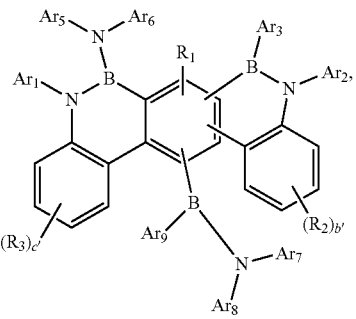

wherein in Formulae 2 to 4,

Ar$_3$ to Ar$_9$ are each independently a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, a' is an integer of 0 to 2, b' and c' are an integer of 0 to 4, and Ar$_1$, Ar$_2$, and R$_1$ to R$_3$ are each independently the same as defined in Formula 1-1.

16. The polycyclic compound of claim 15, wherein Formula 2 is represented by Formula 2-1 or Formula 2-2:

Formula 2-1

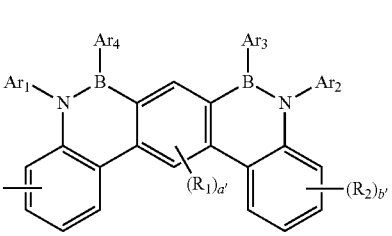

Formula 2-2

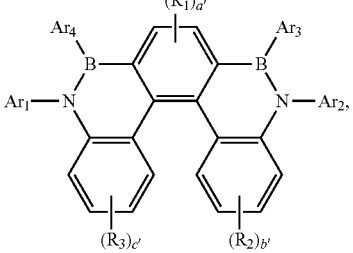

wherein in Formulae 2-1 and 2-2,

Ar$_1$ to Ar$_4$, R$_1$ to R$_3$, a', b', and c' are each independently the same as defined in Formula 2.

17. The polycyclic compound of claim 15, wherein Formula 2 is represented by Formula 2-3:

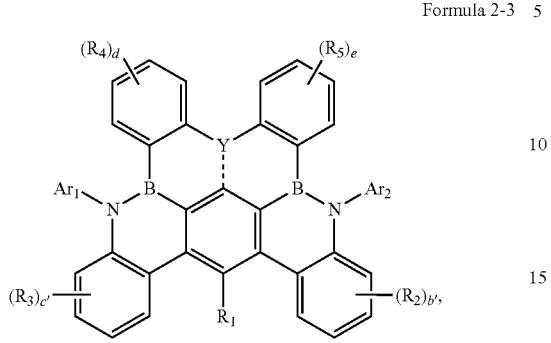

Formula 2-3 wherein in Formula 2-3,

Y is $CR_6$, N, or O, the dotted line is an optional bond, where when Y is $CR_6$ or N, the dotted line is a bond, when Y is O, the bond along the dotted line is omitted, $R_4$ to $R_6$ are each independently a hydrogen atom, a deuterium atom, a halogen atom, a nitro group, a cyano group, a hydroxy group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted hetero aryl silyl group, and/or bonded to an adjacent group to form a ring, d and e are each independently an integer of 0 to 4, and $Ar_1$, $Ar_2$, $R_1$ to $R_3$, b', and c' are each independently the same as defined in Formula 2.

18. The polycyclic compound of claim 15, wherein Formula 3 is represented by Formula 3-1:

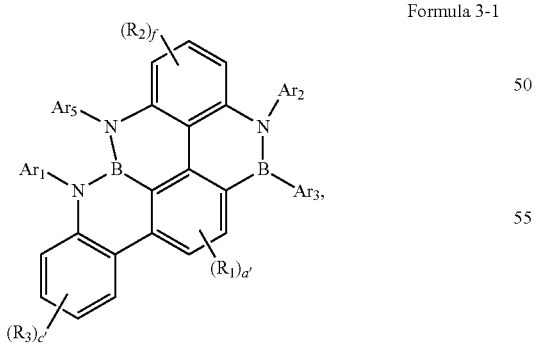

Formula 3-1 wherein in Formula 3-1, f is an integer of 0 to 3, and $Ar_1$ to $Ar_3$, $Ar_5$, $R_1$ to $R_3$, a', and c' are each independently the same as defined in Formula 3.

19. The polycyclic compound of claim 15, wherein Formula 4 is represented by Formula 4-1:

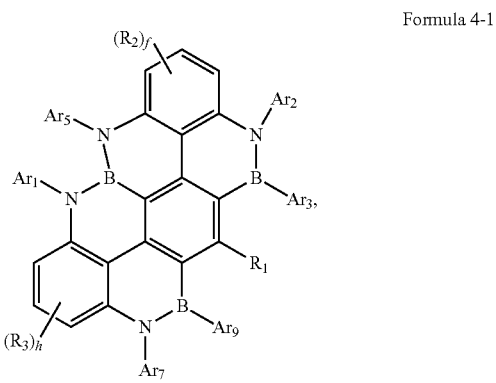

Formula 4-1 wherein in Formula 4-1, f and h are each independently an integer of 0 to 3, and $Ar_1$ to $Ar_3$, $Ar_5$, $Ar_7$, $Ar_9$, and $R_1$ to $R_3$ are each independently the same as defined in Formula 4.

20. The polycyclic compound of claim 14, wherein the compound represented by Formula 1-1 is any one of the compounds represented by Compound Groups 1 to 3:

Compound Group 1

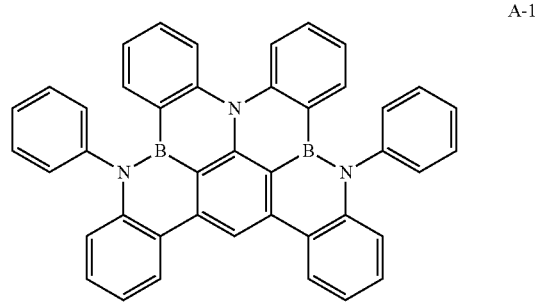

A-1

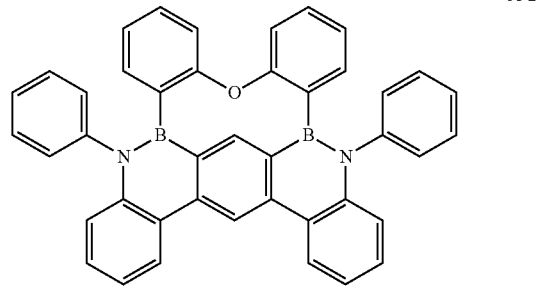

A-2

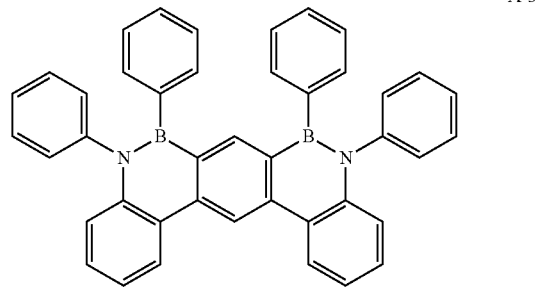

A-3

-continued

A-4

A-5

A-6

A-7

A-8

A-9

A-10

A-11

A-12

A-13

A-14
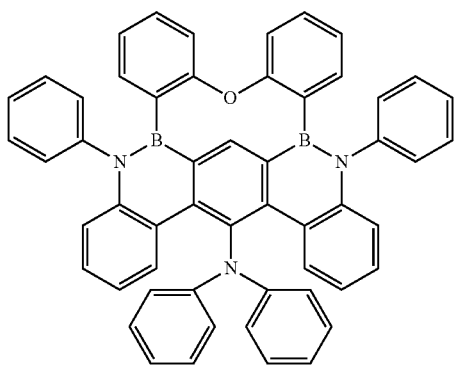
A-18
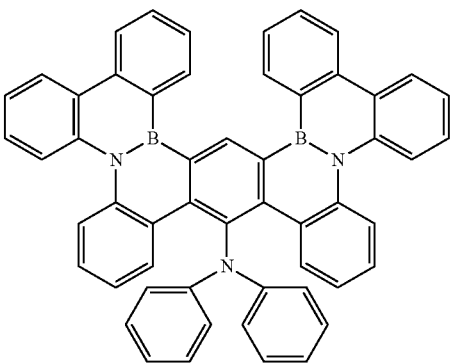
A-15
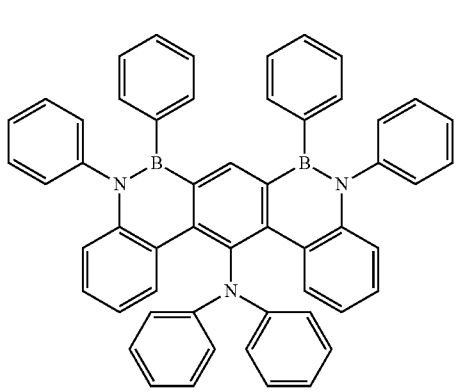
A-1'
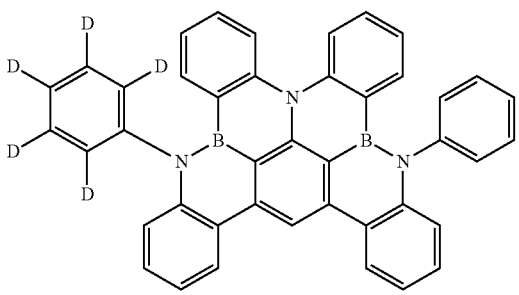
Compound Group 2
A-16
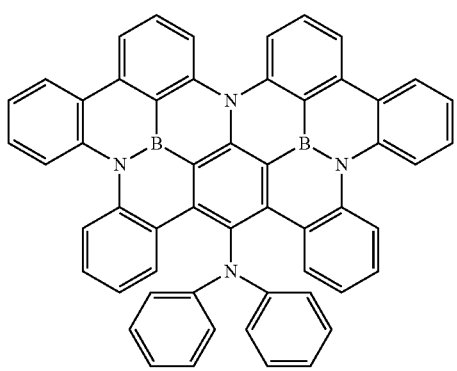
B-1
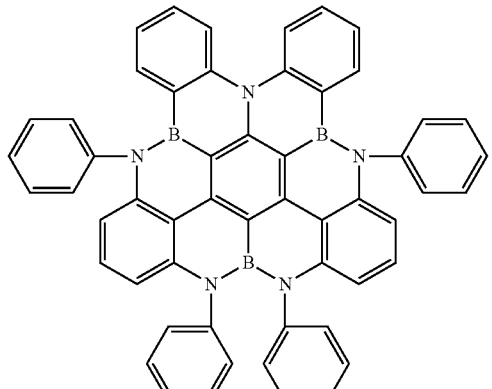
A-17
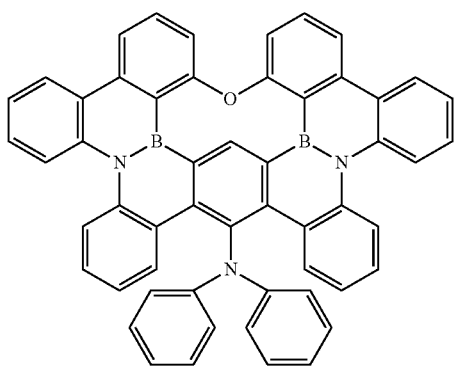
B-2
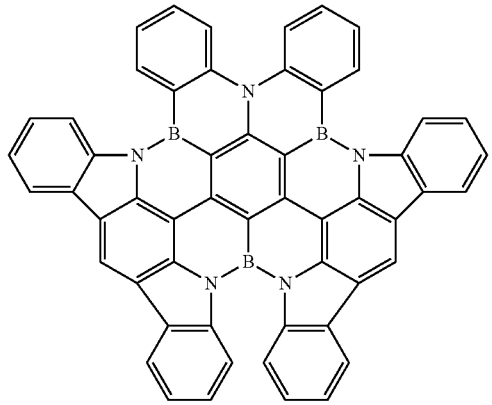

B-3
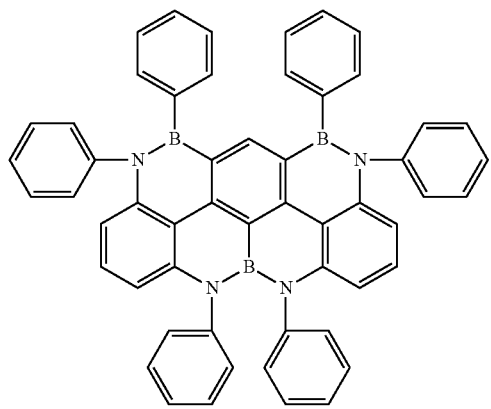
B-7
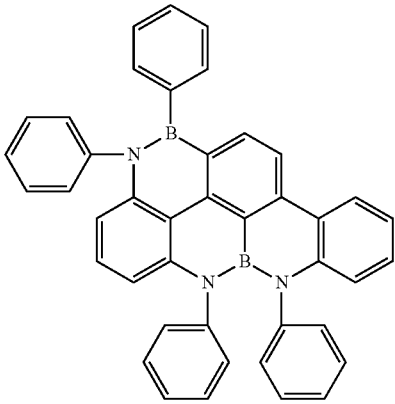
B-4
B-8
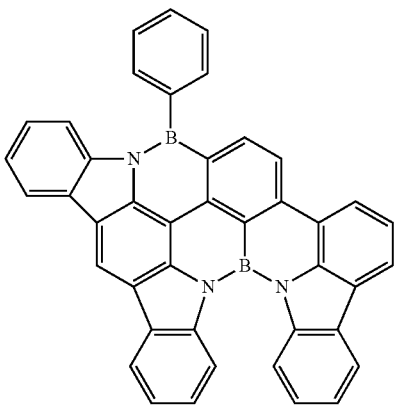
B-5
B-9
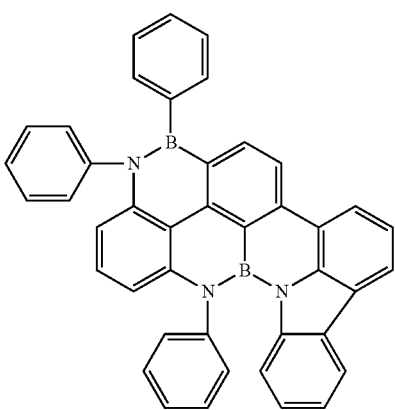
B-6
B-10
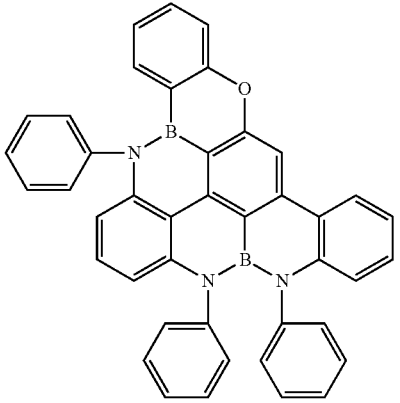

B-11
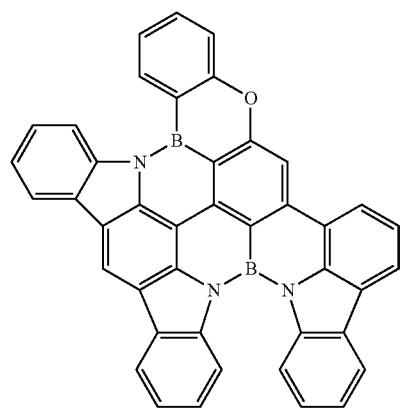
B-12
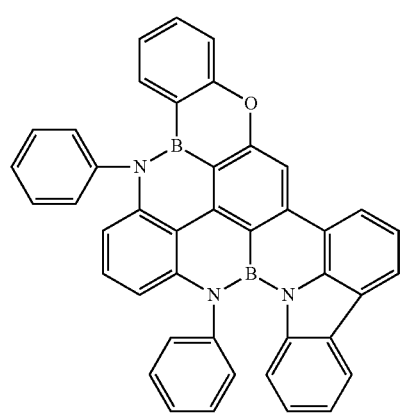
B-13
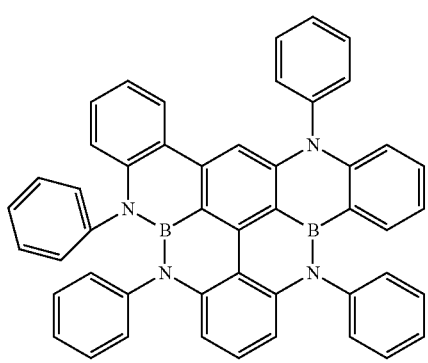
B-14
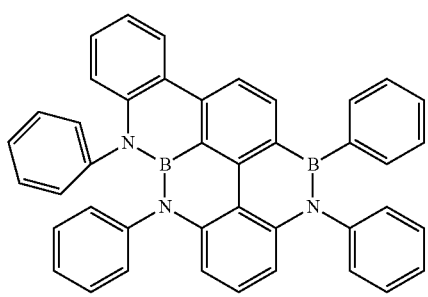
B-15
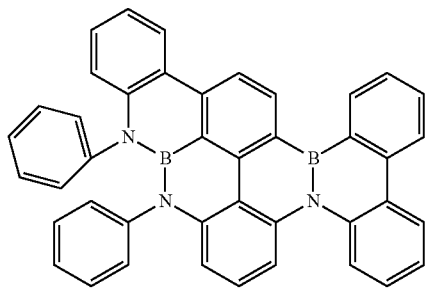
B-16
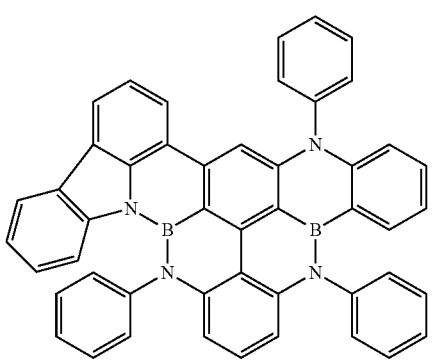
B-17
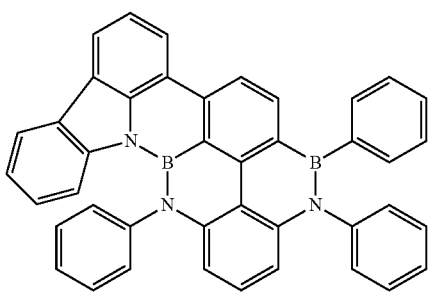
B-18
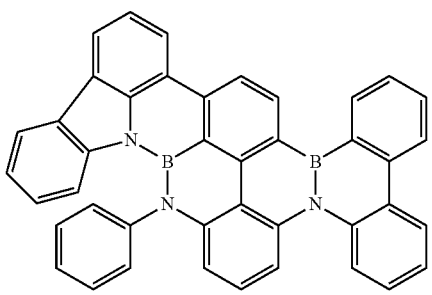
Compound Group 3
C-1
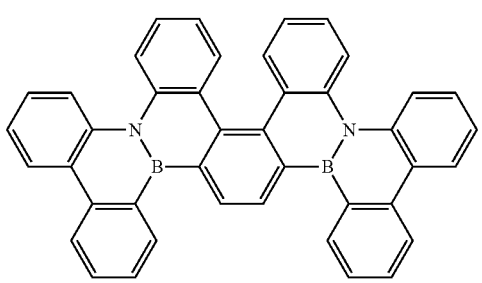

C-2
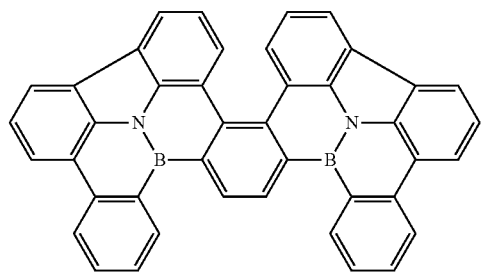
C-3
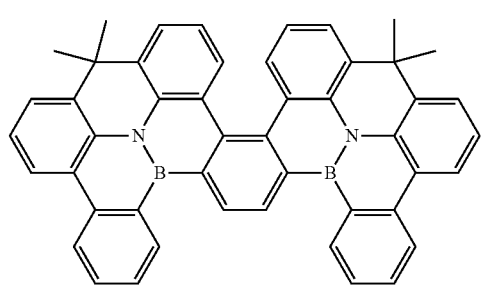
C-4
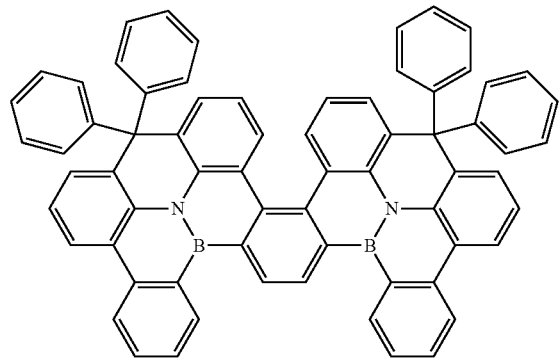
C-5
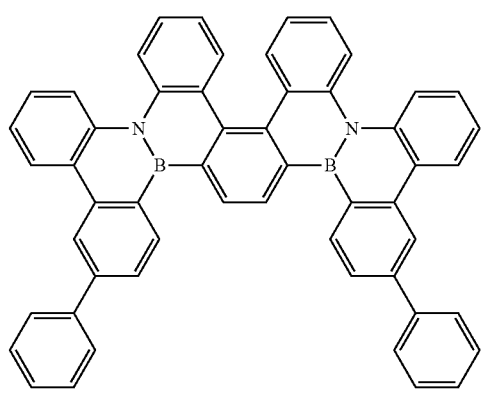
C-6
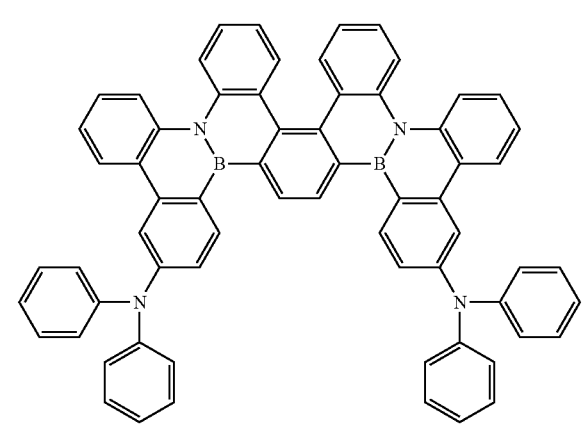
C-7
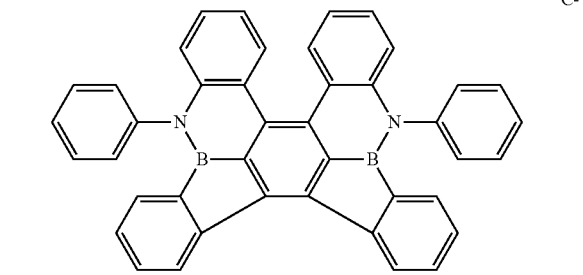
C-8
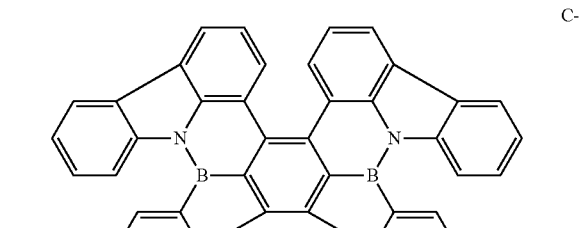
C-9
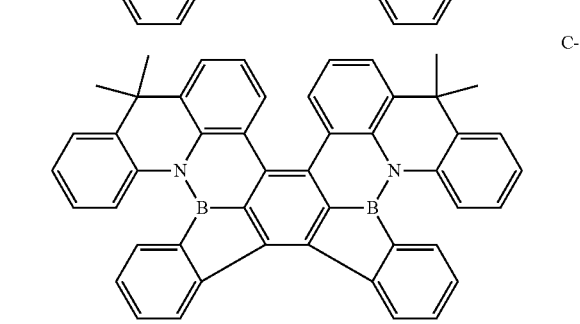
C-10
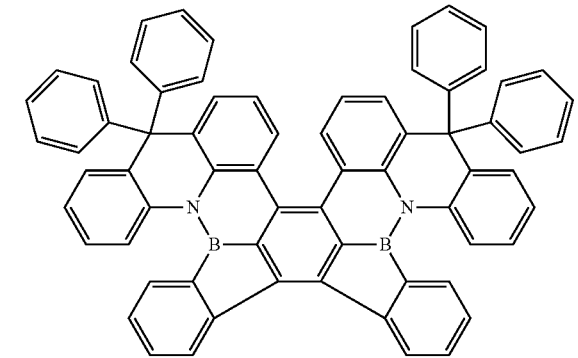

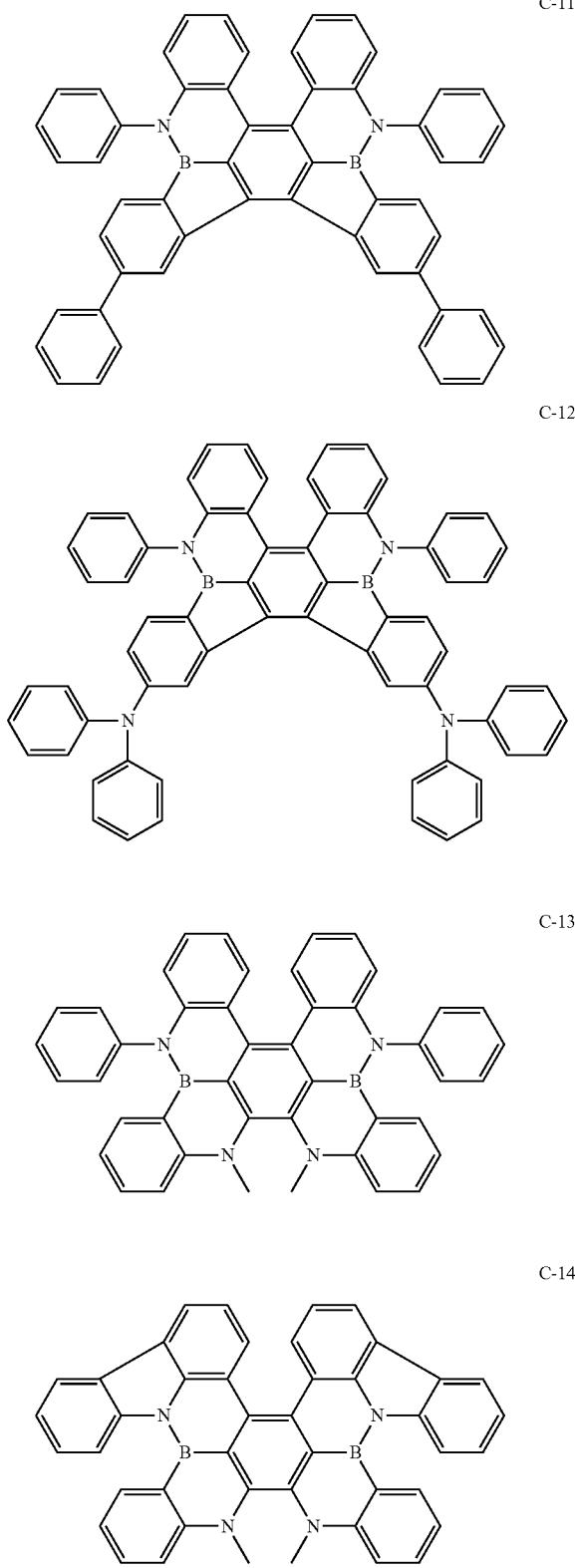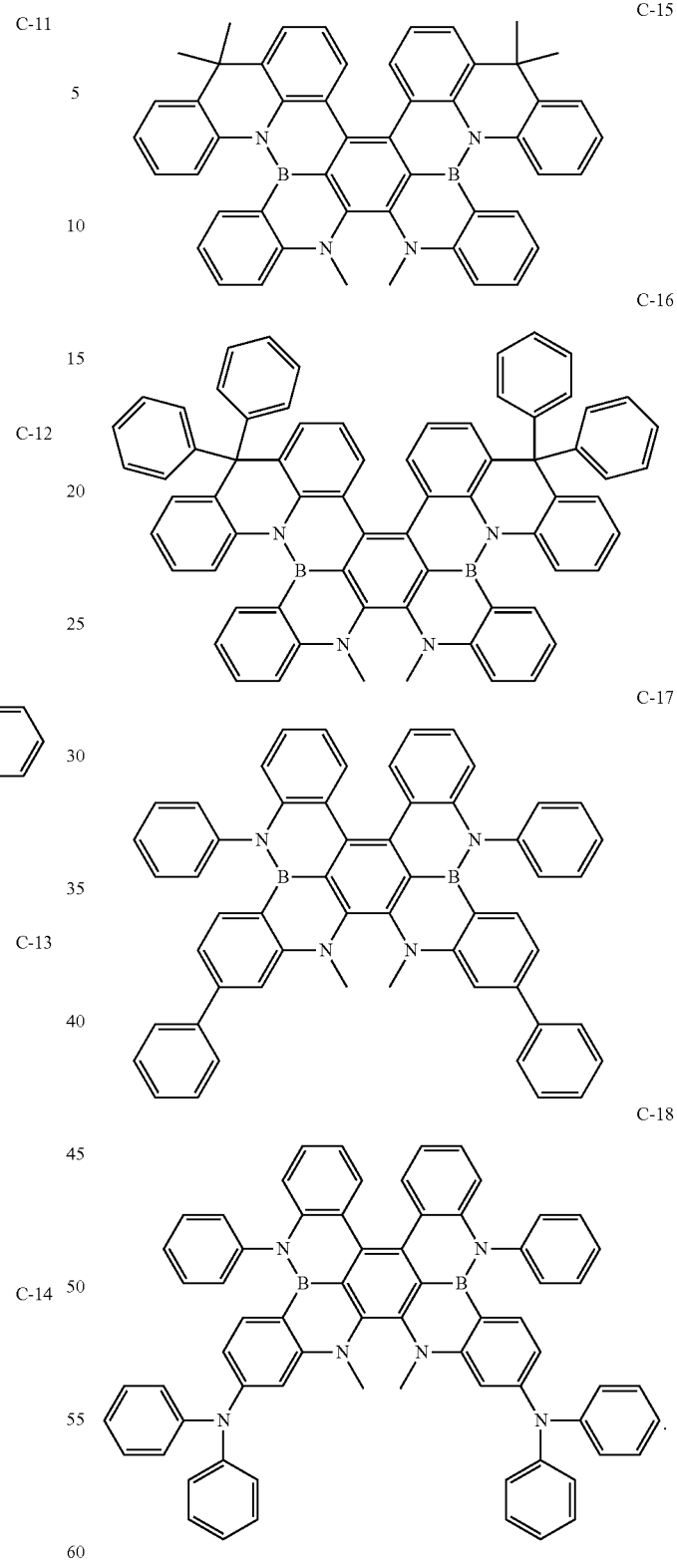
* * * * *